United States Patent
Muto

(10) Patent No.: US 11,336,238 B2
(45) Date of Patent: *May 17, 2022

(54) HIGH-FREQUENCY MODULE AND COMMUNICATION APPARATUS

(71) Applicant: Murata Manufacturing Co., Ltd., Nagaokakyo (JP)

(72) Inventor: Hideki Muto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 466 days.

This patent is subject to a terminal disclaimer.

(21) Appl. No.: 16/161,117

(22) Filed: Oct. 16, 2018

(65) Prior Publication Data

US 2019/0052241 A1    Feb. 14, 2019

Related U.S. Application Data

(63) Continuation of application No. 15/669,046, filed on Aug. 4, 2017, now Pat. No. 10,141,911.

(30) Foreign Application Priority Data

Aug. 5, 2016  (JP) .................................. 2016-155022
Jun. 1, 2017  (JP) .................................. 2017-109028

(51) Int. Cl.
  *H03F 3/195*  (2006.01)
  *H03H 7/46*   (2006.01)
  *H03F 1/56*   (2006.01)

(52) U.S. Cl.
  CPC .............. *H03F 3/195* (2013.01); *H03F 1/56* (2013.01); *H03H 7/46* (2013.01);
  (Continued)

(58) Field of Classification Search
  CPC ...... H03F 1/56; H03F 3/195; H03F 2200/111; H03F 2200/165; H03F 2200/222; H03F 2200/294; H03F 2200/451
  (Continued)

(56) References Cited

U.S. PATENT DOCUMENTS 5,995,814 A * 11/1999 Yeh ..................... H03F 3/191
                                                     455/180.1
6,094,088 A     7/2000 Yano
(Continued)

FOREIGN PATENT DOCUMENTS

CN   103380573 A   10/2013
CN   103733522 A   4/2014
(Continued)

OTHER PUBLICATIONS

Hashemi, et al., "Concurrent Multiband Low-Noise Amplifiers—Theory, Design, and Applications", IEEE Transactions on Microwave Theory and Techniques, vol. 50, No. 1, Jan. 2002, pp. 288-301. (Year: 2002).*

(Continued)

*Primary Examiner* — Hafizur Rahman
(74) *Attorney, Agent, or Firm* — Keating & Bennett, LLP

(57) ABSTRACT

A high-frequency module includes a plurality of filters, a switch that commonly connects a plurality of paths, and a low noise amplifier that amplifies a high-frequency signal input from the plurality of filters with the switch interposed therebetween, wherein paths in which first and second filters are respectively provided among the plurality of paths connect the respective filters and the switch without connecting impedance elements, and each of the first and second filters has an output impedance located in a matching region between a NF matching impedance at which an NF of the low noise amplifier is minimum and a gain matching imped- (Continued)

ance at which a gain of the low noise amplifier is maximum in its respective pass band thereof on a Smith chart.

9 Claims, 19 Drawing Sheets

(52) U.S. Cl.
CPC .. *H03F 2200/111* (2013.01); *H03F 2200/165* (2013.01); *H03F 2200/222* (2013.01); *H03F 2200/294* (2013.01); *H03F 2200/451* (2013.01)

(58) Field of Classification Search
USPC .......................................................... 333/126
See application file for complete search history.

(56) References Cited

U.S. PATENT DOCUMENTS

| | | |
|---|---|---|
| 2002/0075101 A1 | 6/2002 | Takamine |
| 2007/0190954 A1 | 8/2007 | Murakami et al. |
| 2009/0115525 A1* | 5/2009 | Yim .......................... H03F 1/22 330/277 |
| 2012/0208473 A1 | 8/2012 | Aparin |
| 2012/0300679 A1 | 11/2012 | Tsutsumi |
| 2013/0043946 A1 | 2/2013 | Hadjichristos et al. |
| 2013/0278333 A1 | 10/2013 | Corral |
| 2015/0126136 A1 | 5/2015 | Robinett et al. |
| 2015/0296515 A1 | 10/2015 | Pehlivanoglu |

FOREIGN PATENT DOCUMENTS

| | | |
|---|---|---|
| CN | 104980263 A | 10/2015 |
| CN | 105706360 A | 6/2016 |
| JP | 07-7451 A | 1/1995 |
| JP | 10-242826 A | 9/1998 |
| JP | 2002-135078 A | 5/2002 |
| JP | 2012-244615 A | 12/2012 |
| JP | 2015-204628 A | 11/2015 |
| WO | 2005/088833 A1 | 9/2005 |
| WO | 2015/069417 A1 | 5/2015 |

OTHER PUBLICATIONS

Application Note, Matching of EPCOS front-end SAW filters to integrated RKE receivers, App. Note #18, version 1.01, Dec. 2008, RF360 Europe GmbH, a Qualcomm-TDK Joint Venture (Year: 2008).*
Skyworks Product Brief, General purpose RF switch, at www.skyworksinc.com first published on Sep. 6, 2015 (Year: 2015).*
Miller, L. "RF Filter Technology for Dummies", Qorovo Special Edition, 2015 John Wiley & Sons, Qorvo Inc. (Year: 2015).*
Application Note 3169, Low-Noise Amplifier (LNA) Matching Techniques for Optimizing Noise Figures, Jul. 8, 2004. (Year: 2004).*
Ashutosh Bhatt, "Electronic Circuit Designing: Modular Approach (Part 1)", Engineer's Garage, Jun. 2020 (Year: 2020).*
Muto, "High-Frequency Module and Communication Apparatus", U.S. Appl. No. 15/669,046, filed Aug. 4, 2017.
Official Communication issued in corresponding Japanese Patent Application No. 2017-109028, dated Feb. 2, 2021.

* cited by examiner

....... : Gain Circle
---- : NF Circle
—— : Z(Fout)

HIGH-FREQUENCY MODULE AND COMMUNICATION APPARATUS

CROSS REFERENCE TO RELATED APPLICATIONS

This application claims the benefit of priority to Japanese Patent Application No. 2017-109028 filed on Jun. 1, 2017 and Japanese Patent Application No. 2016-155022 filed on Aug. 5, 2016. The entire contents of each application are hereby incorporated herein by reference.

BACKGROUND OF THE INVENTION

1. Field of the Invention

The present invention relates to a high-frequency module and a communication apparatus that include a low noise amplifier.

2. Description of the Related Art

In a mobile communication terminal, an LNA (Low Noise Amplifier) generating less noise is used for a high-frequency module such as a reception-system front end circuit which handles a minute high-frequency signal in order to suppress deterioration in a NF (Noise Figure). A filter is provided at a previous stage of the LNA so as to transmit a desired frequency band such as a reception band and remove unnecessary frequency components.

In the circuit configured as described above, a matching circuit is provided between the filter and the LNA (for example, see Japanese Unexamined Patent Application Publication No. 2006-333390). To be specific, in this configuration, an output impedance of the filter is set to be different from a characteristic impedance intentionally and the matching circuit causes the output impedance and an input impedance of the filter to match with each other (impedance matching).

The mobile communication terminal in recent years is required to be compatible with so-called multiband communication in which one terminal deals with a plurality of frequency bands. With this compatibility, the high-frequency module including the low noise amplifier is also required to be compatible with the multiband communication. However, when a plurality of filters having different pass bands are provided in order to satisfy the requirement, matching circuits for the same number as that of the plurality of filters need to be provided with the above-described existing configuration. This configuration therefore poses an impediment to reduction in the high-frequency module in size.

When a matching circuit common to the plurality of filters is provided or when no matching circuit is provided for size reduction, it is difficult to perform impedance matching for the plurality of bands concurrently and characteristics can be deteriorated. To be specific, the high-frequency module including the low noise amplifier is required to increase a gain while suppressing deterioration in the NF. As for the low noise amplifier, an impedance to achieve impedance matching (so-called gain matching) so as to provide a maximum gain of the low noise amplifier and an impedance to achieve impedance matching (so-called noise matching) so as to provide a minimum NF of the low noise amplifier are different from each other. Therefore, with the configuration including the matching circuit common to the plurality of filters or the configuration including no matching circuit, it is extremely difficult to achieve both of suppression of deterioration in the NF and increase in the gain for the plurality of bands because of frequency characteristics and the like even when they can be achieved for only one band.

SUMMARY OF THE INVENTION

Accordingly, preferred embodiments of the present invention provide high-frequency modules and communication apparatuses that are capable of increasing a gain while suppressing deterioration in an NF, are reduced in size, and are compatible with multiple bands.

According to a preferred embodiment of the present invention, a high-frequency module includes a plurality of filters including first and second filters with pass bands which are different from one another, a connection circuit that commonly connects a plurality of paths in which the plurality of filters are respectively provided, and a low noise amplifier that is connected to the connection circuit, wherein in paths in which the first and second filters are respectively provided among the plurality of paths, the respective filters and the connection circuit are connected without connecting impedance elements, and each of the first and second filters has an output impedance located in a matching region between a noise figure matching impedance at which a noise figure of the low noise amplifier is minimum and a gain matching impedance at which a gain of the low noise amplifier is maximum in a pass band of each of the first and second filters on a Smith chart.

When each of the first and second filters has the above-described output impedance, the gain is increased while suppressing deterioration in the NF without connecting an impedance element in each of the paths in which the first and second filters are respectively provided. That is to say, balance between NF performance and gain performance is significantly improved or optimized without providing individual matching circuits for the first and second filters, which pose an impediment to size reduction. Accordingly, a high-frequency module that is capable of increasing the gain while suppressing the deterioration in the NF, is reduced in size, and is compatible with multiple bands is provided.

Furthermore, a high-frequency module according to a preferred embodiment of the present invention may further include a first impedance adjustment circuit that is connected between the connection circuit and the low noise amplifier, wherein the first impedance adjustment circuit adjusts a first impedance when a circuit portion in which the first impedance adjustment circuit is connected to the low noise amplifier is seen from output sides of the plurality of filters in the case in which the noise figure is minimum and the gain is maximum.

The first impedance is able to be adjusted without depending on an input impedance of the low noise amplifier by including the above-described first impedance adjustment circuit. That is to say, the matching region is able to be located at a position that is appropriate for the output impedances of the first and second filters without depending on the input impedance of the low noise amplifier on the Smith chart. The input impedance of the low noise amplifier and the output impedances of the first and second filters are restricted by various specifications such as the respective circuit configurations and materials and so on. Therefore, the degree of freedom of design of the low noise amplifier and the first and second filters is able to be enhanced by providing the first impedance adjustment circuit.

The first impedance adjustment circuit may adjust the first impedance to be any one of inductive or capacitive in both of the pass bands of the first filter and the second filter among the plurality of filters in the case in which the noise figure is minimum and the gain is maximum.

The matching region is able to be located in one of inductive and capacitive sides on the Smith chart by adjusting the first impedance to be the other of inductive or capacitive in both of the pass bands of the first filter and the second filter as described above. The first and second filters having the configurations in which properties of imaginary components of the output impedances are the same are therefore able to be used.

Furthermore, each of the first and second filters may have the output impedance with a capacitive property in the respective pass band of each of the first and second filters, and the first impedance adjustment circuit may adjust the first impedance to be inductive in both of the pass bands of the first filter and the second filter among the plurality of filters in the case in which the noise figure is minimum and the gain is maximum.

The matching region and the output impedances are able to be made close to each other by adjusting the first impedance to be inductive as described above. Moreover, the NF matching impedance and the gain matching impedance are able to be made close to each other, thus further increasing the gain while further suppressing the deterioration in the NF.

The high-frequency module may further include a functional circuit that is connected between a third filter of the plurality of filters and the connection circuit and is structured and configured to perform a predetermined function.

A required function is able to be added to only a specific band assigned to a pass band of the third filter among the plurality of bands with which the high-frequency module is compatible by providing the above-described functional circuit.

Furthermore, the functional circuit may be a second impedance adjustment circuit that generates a second impedance when a circuit portion in which the functional circuit is connected to the third filter is seen from an input side of the low noise amplifier close to the matching region in a pass band of the third filter on the Smith chart.

By including the second impedance adjustment circuit as the functional circuit, the balance between the NF performance and the gain performance is able to be significantly improved or optimized for each of the first to third filters even when frequency intervals of the pass band of the third filter and the pass bands of the first and second filters are largely separated from each other. Therefore, the plurality of bands with which the high-frequency module is compatible are able to be further widened.

The plurality of filters may include three or more filters, and each of the filters and the connection circuit may be connected without connecting an impedance element in each of the plurality of paths.

With this configuration, a high-frequency module that is capable of increasing the gain while suppressing the deterioration in the NF, is reduced in size, and is compatible with multiple bands of three or more bands is able to be provided.

The connection circuit may be a switch element including a plurality of selection terminals connected to the plurality of filters in an individual correspondence manner and a common terminal connected to the low noise amplifier.

By configuring the connection circuit by the switch element as described above, when only any one of the plurality of selection terminals is connected to the common terminal, the plurality of paths in which the plurality of filters are provided are not connected to one another. This structure and configuration therefore enhances isolation among the plurality of filters.

The connection circuit may include a multiplexer including a first terminal connected to the low noise amplifier and a plurality of second terminals connected to the plurality of filters in an individual correspondence manner.

By configuring the connection circuit to include the multiplexer as described above, two or more high-frequency signals after passing through two or more filters among the plurality of filters are able to be transmitted simultaneously. Therefore, the high-frequency module is able to be applied to CA (Carrier Aggregation) in which transmission and reception are performed using two or more bands among the plurality of bands simultaneously.

In general, insertion loss of the multiplexer is lower than that of the switch. Therefore, according to various preferred embodiments of the present invention, the gain is able to be further increased while further suppressing the deterioration in the NF for the overall high-frequency module in comparison with the configuration in which the switch is provided as the connection circuit.

The plurality of filters may include four or more filters, and the connection circuit may include a first initial stage connection circuit that commonly connects some paths among the plurality of paths, a second initial stage connection circuit that commonly connects at least two paths which are different from the some paths among the plurality of paths, and a posterior stage connection circuit that is connected in a multistage structure to the first and second initial stage connection circuits.

The configuration of the connection circuit in which the circuits are connected in a multistage arrangement as described above enhance isolation among the plurality of filters.

The connection circuit may further include a third impedance adjustment circuit that is connected between the first initial stage connection circuit and the posterior stage connection circuit and generates a third impedance when a circuit portion in which the third impedance adjustment circuit is connected to the first initial stage connection circuit is seen from an input side of the low noise amplifier close to the matching region in pass bands of some filters provided in the some paths among the plurality of filters on the Smith chart.

Frequency bands of bands assigned to the some filters provided in the some paths that are commonly connected by the first initial stage connection circuit among the plurality of bands with which the high-frequency module is compatible are referred to as a first frequency band. Frequency bands of bands assigned to at least two filters provided in the at least two paths that are commonly connected by the second initial stage connection circuit among the plurality of bands with which the high-frequency module is compatible are referred to as a second frequency band.

When the connection circuit includes the third impedance adjustment circuit as described above, the balance between the NF performance and the gain performance is able to be optimized for each of the above-described some filters and the above-described at least two filters even when the frequency intervals of the first frequency band and the second frequency band are largely separated from each other. Therefore, the high-frequency module is able to be compatible with a large number of bands having largely different frequencies in the plurality of bands with which the high-frequency module is compatible. The bands having the largely different frequencies indicate bands the frequencies of which are largely different, such as an HB (High-Frequency) band (for example, band of about 2.5 GHz) and an MB (Medium-Frequency) band (for example, band of about 1800 MHz).

The posterior stage connection circuit may include a branch portion branching a path connected to an input terminal of the low noise amplifier into a path connected to a common terminal of the first initial stage connection circuit and a path connected to a common terminal of the second initial stage connection circuit.

The high-frequency module is able to have the simplified configuration by providing the posterior stage connection circuit with the branch portion.

Each of the plurality of filters may include an elastic wave resonator using surface acoustic waves, bulk waves, or boundary acoustic waves.

The high-frequency module is able to be further reduced in size because the plurality of filters include the elastic wave resonators and are thus reduced in size. The plurality of filters are configured by the elastic wave resonators having generally high Q characteristics, thus reducing losses of the plurality of filters. Accordingly, the gain is increased while suppressing the deterioration in the NF for the overall high-frequency module.

A communication apparatus according to another preferred embodiment of the present invention includes an RF signal processing circuit that processes a high-frequency signal which is transmitted and received with an antenna element, and the high-frequency module according to any one of the above-described preferred embodiments of the present invention that transmits the high-frequency signal between the antenna element and the RF signal processing circuit.

With this configuration, communication apparatuses that are capable of increasing the gain while suppressing the deterioration in the NF, are reduced in size, and are compatible with multiple bands are able to be provided.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
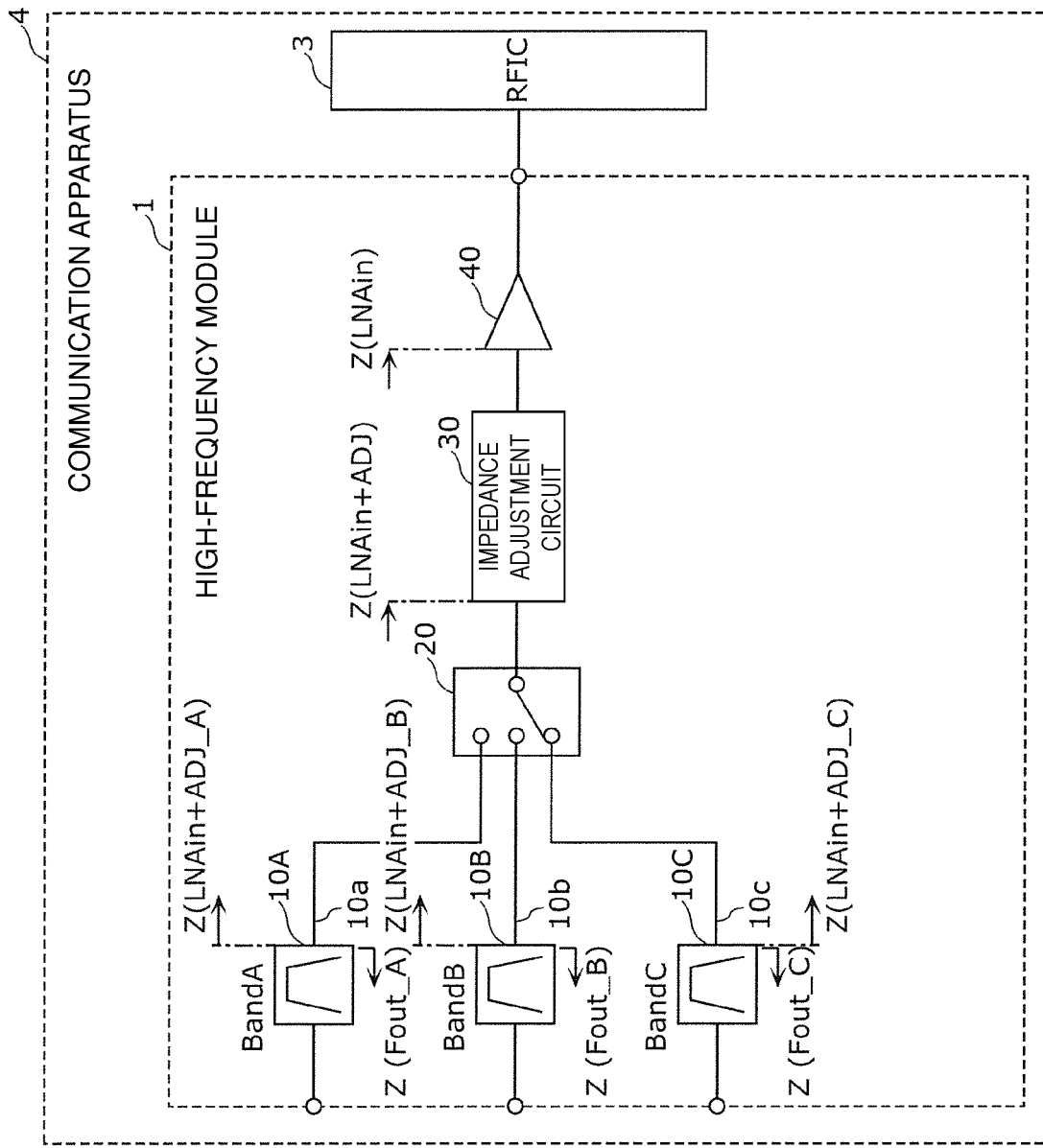
FIG. 1 is a circuit configuration diagram of a high-frequency module according to a preferred embodiment of the present invention.

Hereinafter, preferred embodiments of the present invention and variations thereof will be described in detail with reference to the drawings. It should be noted that all of the preferred embodiments and variations which will be described below indicate comprehensive or specific examples. Numerical values, shapes, materials, components, arrangement and connection forms of the components, and the like which will be described in the following preferred embodiments and variations are examples and are not intended to limit the present invention. Components that are not described in independent claims among the components in the following preferred embodiments and variations are described as arbitrary components. The sizes or the size ratios of the components illustrated in the drawings are not necessarily strict or limited.

FIG. 1 is a circuit configuration diagram of a high-frequency module 1 according to a preferred embodiment of the present invention. FIG. 1 also illustrates an RF signal processing circuit (RFIC (Radio Frequency Integrated Circuit)) 3 configuring a communication apparatus 4 together with the high-frequency module 1.

The RFIC 3 is an RF signal processing circuit that processes a high-frequency signal which is transmitted and received with an antenna element (not illustrated). To be specific, the RFIC 3 performs signal processing on the high-frequency signal (in this example, a high-frequency reception signal) input from the antenna element with the high-frequency module 1 interposed therebetween by down conversion or the like, and outputs a reception signal generated by the signal processing to a baseband signal processing circuit (not illustrated).

In the present preferred embodiment, the RFIC 3 also is configured or programmed to function as a controller that controls connection of a switch 20 (which will be described later) included in the high-frequency module 1 based on a frequency band to be used. To be specific, the RFIC 3 switches a selection terminal that is connected to a common terminal for the switch 20 with a control signal (not illustrated). The controller may be provided at the outside of the RFIC 3 or may be provided in, for example, the high-frequency module 1 or the baseband signal processing circuit (not illustrated).

Next, the detail configuration of the high-frequency module 1 will be described.

As illustrated in FIG. 1, the high-frequency module 1 includes a plurality of filters (three filters 10A to 10C in the present preferred embodiment), a connection circuit (switch 20 in the present preferred embodiment), an impedance adjustment circuit 30 (first impedance adjustment circuit), and a low noise amplifier 40.

The filters 10A to 10C are, for example, bandpass filters having pass bands which are different from one another. To be specific, Band A is assigned to the filter 10A, Band B is assigned to the filter 10B, and Band C is assigned to the filter 10C as the pass bands.

In the present preferred embodiment, the filters 10A to 10C have output impedances with capacitive properties in their respective pass bands. To be specific, each of the filters 10A to 10C preferably includes an elastic wave resonator using surface acoustic waves.

It should be noted that the elastic wave resonator may be a SAW (Surface Acoustic Wave) resonator, for example.

When the SAW resonator is used, it preferably includes a substrate and IDT (Interdigital transducer) electrodes. The substrate has piezoelectricity on at least the surface thereof. For example, the substrate may include a multilayer body including a piezoelectric thin film on the surface thereof, a film with an acoustic speed which is different from that of the piezoelectric film, a support substrate, and the like. The overall substrate may have piezoelectricity. In this case, the substrate is a piezoelectric substrate defined by one layer of a piezoelectric body, for example.

It should be noted that the filters 10A to 10C are not limited to the bandpass filters and may be high pass filters or low pass filters. Furthermore, the number of filters is not limited to the above-described number and, for example, may be two or four or more. Each of the filters 10A to 10C is not limited to have the above-described configuration and may be configured by an elastic wave resonator using bulk waves or boundary acoustic waves.

The switch 20 is the connection circuit that commonly connects a plurality of paths in which the plurality of filters are provided (in the present preferred embodiment, three paths 10a to 10c in which the three filters 10A to 10C are respectively provided). In the present preferred embodiment, the three paths 10a to 10c in which the three filters 10A to 10C are respectively provided connect the respective filters and the switch 20 without connecting impedance elements (for example, inductors, capacitors, or the like).

To be specific, the switch 20 preferably is an SPnT (Single Pole n Throw)-type (n is the number of filters and three in the present preferred embodiment) switch element including a plurality of selection terminals connected to the plurality of filters 10A to 10C in an individual correspondence manner and a common terminal connected to the low noise amplifier 40. In the present preferred embodiment, the common terminal of the switch 20 is connected to the low noise amplifier 40 with the impedance adjustment circuit 30 interposed therebetween.

The impedance adjustment circuit 30 is the first impedance adjustment circuit that is connected between the connection circuit (switch 20 in the preferred embodiment) and the low noise amplifier 40. The impedance adjustment circuit 30 adjusts an impedance Z(LNAin+ADJ) (first impedance) when a circuit portion in which the impedance adjustment circuit 30 is connected to the low noise amplifier 40 is seen from the output sides of the filters 10A to 10C to thus adjust an impedance Z(LNAin+ADJ_A), an impedance Z(LNAin+ADJ_B), and an impedance Z(LNAin+ADJ_C). That is to say, the impedance when the low noise amplifier 40 is seen from the output sides of the filters 10A to 10C is adjusted to the impedance Z(LNAin+ADJ_A), the impedance Z(LNAin+ADJ_B), and the impedance Z(LNAin+ADJ_C) from an impedance Z(LNAin) (that is, an input impedance of the low noise amplifier 40) in the case of providing no impedance adjustment circuit 30.

The impedance Z(LNAin+ADJ_A), the impedance Z(LNAin+ADJ_B), and the impedance Z(LNAin+ADJ_C) are the impedances in the pass bands of the filters 10A to 10C when the low noise amplifier 40 is seen from the filters 10A to 10C, respectively.

The impedance adjustment circuit 30 preferably includes, for example, an inductor connected in series to a path connecting an input terminal and an output terminal. The configuration of the impedance adjustment circuit 30 is not limited thereto and it is sufficient that the impedance adjustment circuit 30 includes an impedance element connected to the path. To be specific, the impedance adjustment circuit 30 may include an inductor or a capacitor connected in series to the path connecting the input terminal and the output terminal or an inductor or a capacitor connected in series to a path connecting the path and the ground. It is sufficient that the circuit configuration of the impedance adjustment circuit 30 and a constant of the impedance element are appropriately determined in consideration of impedance adjustment required to be performed by the impedance adjustment circuit 30 based on the input impedance L(LNAin) of the low noise amplifier 40 and output impedances Z(Fout_A) to Z(Fout_C) of the filters 10A to 10C.

The low noise amplifier 40 is a low noise amplifier circuit that amplifies high-frequency signals input from the plurality of filters (for example, three filters 10A to 10C in the present preferred embodiment) with the connection circuit (switch 20 in the present preferred embodiment) interposed therebetween, and includes a transistor or the like.

In the high-frequency module 1 configured as described above, the plurality of paths 10a to 10c are bundled without connecting impedance elements, thus reducing the high-frequency module in size and making it be compatible with multiple bands.

In general, in a high-frequency circuit (distribution constant circuit), loss and the like are generated and an NF is deteriorated depending on an impedance relationship between connected circuits (for example, filters, LNA, and the like). All of the loss, the NF, and the like are factors deteriorating the characteristics of the overall high-frequency circuit. For this reason, when the high-frequency circuit is designed, impedance matching to adjust the impedance relationship between the connected circuits is required.

As for the low noise amplifier 40, an NF matching impedance as an impedance to achieve impedance matching (NF matching) so as to provide a minimum NF of the low noise amplifier and a gain matching impedance as an impedance to achieve impedance matching (gain matching) so as to provide a maximum gain of the low noise amplifier 40 are different from each other.

Therefore, when, for example, the NF matching for the low noise amplifier 40 is performed in order to improve the NF, reflection by the low noise amplifier 40 is increased due to deterioration in the gain matching. In this case, loss of the circuit (filters 10A to 10C, and the like) at the previous stage of the low noise amplifier 40 is increased, which leads to deterioration in the NF of the overall high-frequency module 1. On the other hand, when the gain matching for the low noise amplifier 40 is performed in order to improve the gain performance of the low noise amplifier 40, the NF of the low noise amplifier 40 is deteriorated due to deterioration in the NF matching. Even this case also leads to the deterioration in the NF of the overall high-frequency module 1.

Accordingly, in order to increase the gain while suppressing the deterioration in the NF of the overall high-frequency module 1, the impedances (the output impedances of the filters 10A to 10C in the present preferred embodiment) when the circuit at the previous stage is seen from the low noise amplifier 40 need to be set between the NF matching impedance at which the NF of the low noise amplifier 40 is minimum and the gain matching impedance at which the gain of the low noise amplifier 40 is maximum.

Figure 2:
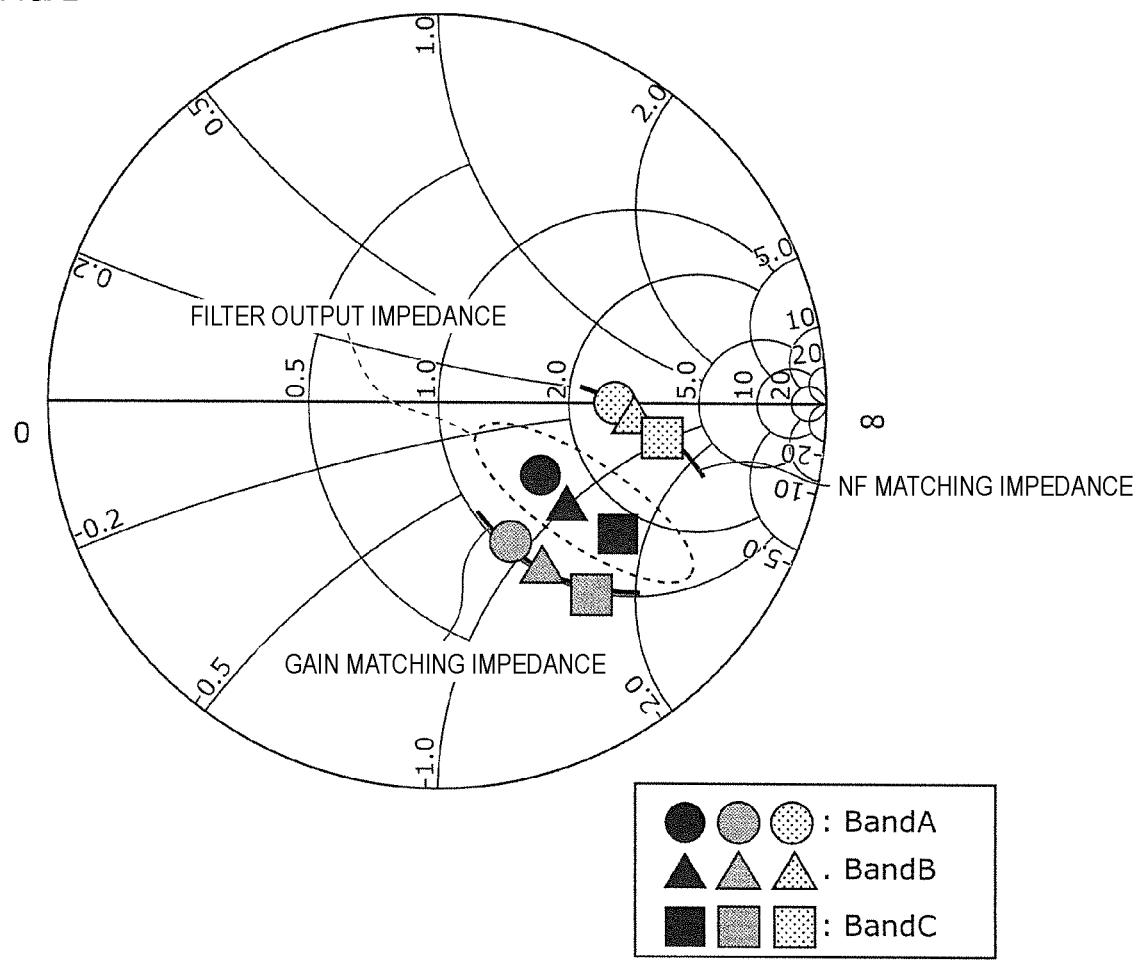
FIG. 2 is a Smith chart illustrating positions defining output impedances of filters in a preferred embodiment of the present invention.

FIG. 2 is a Smith chart illustrating positions defining the output impedances of the filters 10A to 10C in the present preferred embodiment.

As illustrated in FIG. 2, each of the filters 10A to 10C has the output impedance located in a matching region between the NF matching impedance at which the NF of the low noise amplifier 40 is minimum and the gain matching impedance at which the gain of the low noise amplifier 40 is maximum in its respective pass band on the Smith chart.

To be specific, each of the NF matching impedance and the gain matching impedance has frequency characteristics and therefore draws a trajectory as indicated by a bold line on the Smith chart. Therefore, for example, the filter 10A has the output impedance located between the NF matching impedance in Band A and the gain matching impedance in Band A on the Smith chart. It should be noted that the filters 10B and 10C have the similar output impedances except the point that the pass bands thereof are different from that of the filter 10A.

The impedance adjustment circuit 30 is provided between the connection circuit (switch 20) and the low noise amplifier 40 in the present preferred embodiment. The NF of the low noise amplifier 40 is minimum and the gain thereof is maximum at the NF matching impedance and the gain matching impedance illustrated in FIG. 2, respectively. Therefore, the circuit configuration (filters 10A to 10C in the preferred embodiment) connected to the low noise amplifier 40 with the impedance adjustment circuit 30 interposed therebetween is required to provide these impedances.

This will be explained with reference to FIGS. 3A to 3C.

Figure 3:
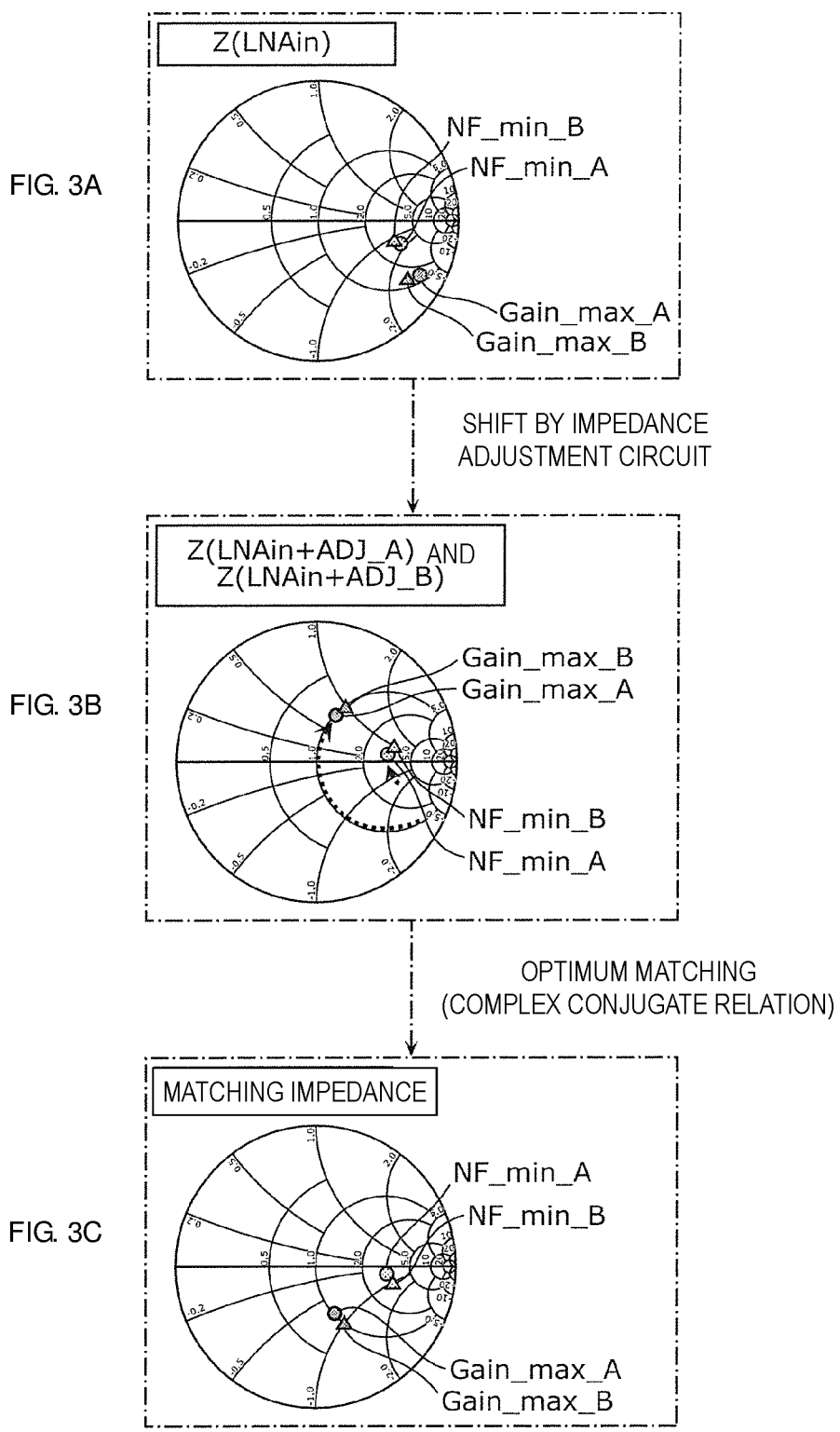
FIGS. 3A to 3C illustrate Smith charts for explaining an NF matching impedance and a gain matching impedance.

FIGS. 3A to 3C are Smith charts for explaining the NF matching impedance and the gain matching impedance. To be specific, FIG. 3A is the Smith chart illustrating the impedance (impedance "NF_min_A" in FIG. 3A) at which the NF is minimum and the impedance (impedance "Gain_max_A" in FIG. 3A) at which the gain is maximum when the low noise amplifier 40 is seen from the output side of the filter 10A and illustrating the impedance (impedance "NF_min_B" in FIG. 3A) at which the NF is minimum and the impedance (impedance "Gain_max_B" in FIG. 3A) at which the gain is maximum when the low noise amplifier 40 is seen from the output side of the filter 10B. FIG. 3B is the Smith chart illustrating the above-described four impedances when the circuit portion in which the impedance adjustment circuit 30 is connected to the low noise amplifier 40 is seen from the output sides of the filters 10A and 10B. FIG. 3C is the Smith chart illustrating impedances (that is, impedances at which matching is optimum) matching with the respective four impedances illustrated in FIG. 3B.

It should be noted that FIGS. 3A to 3C illustrate the impedances while focusing on the two frequencies for simple explanation. Hereinafter, the connection circuit (switch 20 in the present preferred embodiment) is handled as an ideal circuit in which the impedance is not changed between the input and output sides and wirings connecting the circuits are handled as ideal wirings having electric lengths of zero for description. Practical circuit design should be made in consideration of variations in the impedance and a phase with the above-described connection circuit and wirings.

As illustrated in FIGS. 3A and 3B, the impedances ("NF_min_A" and "NF_min_B" in FIG. 3A) at which the NF is minimum and the impedances ("Gain_max_A" and "Gain_max_B" in FIG. 3A) at which the gain is maximum shift with the impedance adjustment circuit 30. In this case, impedance change to FIG. 3B from FIG. 3A is defined by the circuit configuration of the impedance adjustment circuit 30 and the constant of the impedance element. The impedance change when the inductor as the impedance adjustment circuit 30 is connected in series to the path connecting the input terminal and the output terminal is illustrated in FIGS. 3A and 3B.

To be specific, the impedance adjustment circuit 30 adjusts at least two of the impedance Z(LNAin+ADJ_A), the impedance Z(LNAin+ADJ_B), and the impedance Z(LNAin+ADJ_C) to be any one of inductive or capacitive in the case in which the NF is minimum and the gain is maximum. In the present preferred embodiment, as illustrated in FIG. 3B, the impedance adjustment circuit 30 adjusts the impedance Z(LNAin+ADJ_A) and the impedance Z(LNAin+ADJ_B) in the pass bands of the plurality of filters 10A and 10B to be inductive.

When the impedance Z(LNAin+ADJ_A) and the impedance Z(LNAin+ADJ_B) at which the NF is minimum and those at which the gain is maximum are located as illustrated in FIG. 3B, the impedances matching therewith are substantially complex conjugate impedances of the impedances illustrated in FIG. 3B, as illustrated in FIG. 3C.

That is to say, when the output impedance Z(Fout_A) of the filter 10A has the output impedance (NF matching impedance) indicated by "NF_min_A" in FIG. 3C, the NF of the low noise amplifier 40 is minimum. On the other hand, when the output impedance Z(Fout_A) has the output impedance (gain matching impedance) indicated by "Gain_max_A" in FIG. 3C, the gain of the low noise amplifier 40 is maximum.

In the same manner, when the output impedance Z(Fout_B) of the filter 10B has the output impedance (NF matching impedance) indicated by "NF_min_B" in FIG. 3C, the NF of the low noise amplifier 40 is minimum. On the other hand, when the output impedance Z(Fout_B) has the output impedance (gain matching impedance) indicated by "Gain_max_B" in FIG. 3C, the gain of the low noise amplifier 40 is maximum.

As described above, the positions of the impedances at which the NF is minimum and the positions of the impedances at which the gain is maximum, which are illustrated in FIG. 3C, are defined by FIG. 3B. That is to say, the impedance adjustment circuit 30 adjusts these positions. In other words, the impedance adjustment circuit 30 is able to adjust the position of the matching region between the NF matching impedance and the gain matching impedance on the Smith chart. Accordingly, the impedance adjustment circuit 30 adjusts the matching region to a region in which the output impedances Z(Fout_A) to Z(Fout_C) of the plurality of filters 10A to 10C are easy to be located, thus increasing the gain while suppressing the deterioration in the NF for the plurality of bands.

It is sufficient that at least two of the output impedances Z(Fout_A) to Z(Fout_C) of the filters 10A to 10C are located in the matching region in their respective pass bands. That is to say, this requirement is satisfied by not only the case in which the output impedances in only a portion of their respective pass bands are located in the matching region but also the case in which the output impedances in their respective pass bands overall are located in the matching region. When, for example, one or more band(s) is(are) assigned to the pass bands of the filters 10A to 10C, the output impedances Z(Fout_A) to Z(Fout_C) of the filters 10A to 10C may be located in the matching region at an arbitrary frequency in one band of the one or more band(s) assigned to their respective pass bands.

Figure 4:
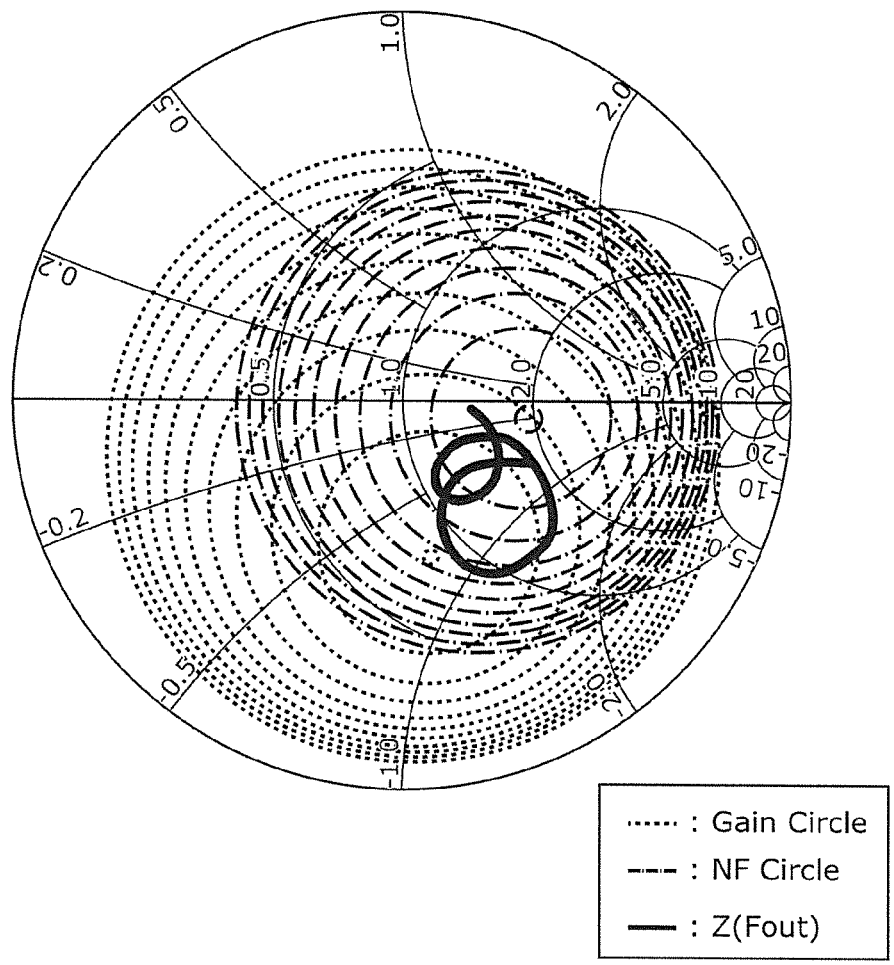
FIG. 4 is a Smith chart illustrating the output impedance of the filter when focusing on one band in a preferred embodiment of the present invention.

FIG. 4 is the Smith chart illustrating the output impedance Z(Fout) of the filter (any one of the filters 10A to 10C) when focusing on one band in the present preferred embodiment. FIG. 4 also illustrates NF circles (equivalent NF circles) and gain circles (equivalent gain circles) at the center frequency in the above-described band when the filter side is seen from the output side of the filter. To be specific, the NF circle indicates the output impedances of the filter with which the low noise amplifier 40 has an equivalent NF and the gain circle indicates the output impedances of the filter with which the low noise amplifier 40 has an equivalent gain.

As illustrated in FIG. 4, the output impedance Z(Fout) in one band draws a trajectory from a frequency at a low-frequency edge of the band to a frequency at a high-frequency edge thereof on the Smith chart. The trajectory is located in the matching region between a center point of the NF circles (that is, NF matching impedance) and a center point of the gain circles (that is, gain matching impedance). In other words, the trajectory of the impedance in the band intersects with a line connecting the center point of the NF circles and the center point of the gain circles.

Hereinafter, advantageous effects that are provided by the high-frequency module 1 in the present preferred embodiment are described while including circumstances which have derived the preferred embodiments of the present invention.

In general, as the high-frequency module satisfying a requirement for size reduction and compatibility with multiple bands, the configuration in which an LNA is provided commonly to a plurality of filters can be considered. However, when filters designed in a common 50 Ω system are used, a plurality of matching circuits need to be individually provided at the subsequent stages of the plurality of filters in order to satisfy optimum design to increase a gain while suppressing deterioration in an NF. The high-frequency module configured as described above can however deteriorate the NF of the overall high-frequency module due to an increase in loss, pose an impediment to size reduction due to increase in the number of components, and so on.

Furthermore, as the high-frequency module satisfying the above-described requirement, the configuration in which not only the LNA but also the matching circuit is commonly provided is considered. It is however difficult to satisfy the above-described optimum design for all of the bands when the filters designed in the common 50 Ω system are used because both of a matching impedance at which the NF of the LNA is minimum and a matching impedance at which the gain of the LNA is maximum have frequency characteristics. To be specific, when the high-frequency module is configured so as to satisfy the above-described optimum design for one band, the NF is deteriorated or the gain is lowered for the other bands. For this reason, it is difficult to sufficiently bring out gain performance and NF performance of the LNA for the other bands.

Meanwhile, as the high-frequency module satisfying the above-described optimum design for all of the bands, the configuration in which the matching circuits and the LNAs are provided in an individual correspondence manner to the plurality of filters can be considered. This configuration however increases a circuit scale due to increase in the number of components of the matching circuits and the LNAs and has difficulty in reducing the size and cost. Moreover, fluctuation in quality among the high-frequency modules is easy to occur.

To cope with these circumstances, the present inventor has discovered the configuration of the high-frequency module 1 that satisfies the optimum design to increase the gain while suppressing the deterioration in the NF, is capable of being reduced in size, and is compatible with multiple bands by using the plurality of filters (for example, three filters 10A to 10C in the present preferred embodiment) with adjusted (customized) output impedances. A method to adjust the output impedances of the filters 10A to 10C is not particularly limited but examples thereof include the following. To be specific, when each filter is a surface acoustic wave filter configured by a plurality of IDT (InterDigital Transducer) electrodes, the output impedance is adjusted by making electrode parameters such as a pitch of electrode fingers, an intersecting width, the number of pairs of electrode fingers, and an interval between reflectors and the IDT electrode of the IDT electrode different among the IDT electrodes. When each filter includes ladder-type elastic wave resonators, the output impedance is adjusted by making the impedance of the elastic wave resonator arranged at the closest position to an output terminal of the filter be higher or lower than those of the other elastic wave resonators.

That is to say, with the high-frequency module 1 in the present preferred embodiment, first and second filters (any two filters of the filters 10A to 10C in the preferred embodiment) have the output impedances located in the matching region between the NF matching impedance and the gain matching impedance (see FIG. 2). With this, the gain is increased while suppressing the deterioration in the NF without connecting impedance elements in the paths in which the first and second filters are provided. That is to say, balance between the NF performance and the gain performance is able to be optimized without providing individual matching circuits for the first and second filters, which pose an impediment to size reduction. Accordingly, the high-frequency module 1 that is capable of increasing the gain while suppressing the deterioration in the NF, is reduced in size, and is compatible with the multiple bands is able to be provided.

In particular, the high-frequency module 1 in the present preferred embodiment includes three or more (for example, three in the present preferred embodiment) filters 10A to 10C and each of the plurality of paths 10a to 10c connects each of the filters and the connection circuit (switch 20 in the present preferred embodiment) without connecting impedance elements. With this configuration, the high-frequency module 1 that is capable of increasing the gain while suppressing the deterioration in the NF, is reduced in size, and is compatible with the multiple bands of three or more bands is able to be provided.

The high-frequency module 1 in the present preferred embodiment includes the impedance adjustment circuit 30 (first impedance adjustment circuit). With the impedance adjustment circuit 30, the impedance Z(LNAin+ADJ) (first impedance) when the circuit portion in which the impedance adjustment circuit 30 is connected to the low noise amplifier 40 is seen from the output sides of the plurality of filters 10A to 10C can be adjusted without depending on the input impedance Z(LNAin) of the low noise amplifier 40. Therefore, the impedance Z(LNAin+ADJ_A), the impedance Z(LNAin+ADJ_B), and the impedance Z(LNAin+ADJ_C) of the respective paths 10a to 10c when the low noise amplifier 40 is seen from the respective filters 10A to 10C can be adjusted. That is to say, the matching region is able to be located at a position that is appropriate for the output impedances of the first and second filters without depending on the input impedance Z(LNAin) of the low noise amplifier 40 on the Smith chart. The input impedance Z(LNAin) of the low noise amplifier 40 and the output impedances of the first and second filters are restricted by various specifications such as the respective circuit configurations and materials and so on. Therefore, the degree of freedom of design of the low noise amplifier 40 and the first and second filters is enhanced by providing the impedance adjustment circuit 30.

To be specific, with the high-frequency module 1 in the present preferred embodiment, at least two impedances of the impedances (Z(LNAin+ADJ_A), Z(LNAin+ADJ_B), and Z(LNAin+ADJ_C)) of the respective paths 10a to 10c when the low noise amplifier 40 is seen from the respective filters 10A to 10C are adjusted to be one of inductive or capacitive in both of the pass bands thereof, thus locating the matching region in the other of inductive and capacitive sides on the Smith chart. The first and second filters having the configurations in which properties of imaginary components of the output impedances are the same are therefore able to be used.

To be more specific, the matching region and the output impedances of at least two filters are able to be made close to each other by adjusting at least two of the impedances (Z(LNAin+ADJ_A), Z(LNAin+ADJ_B), and Z(LNAin+ADJ_C)) of the respective paths 10a to 10c when the low noise amplifier 40 is seen from the respective filters 10A to 10C to be inductive. In addition, the NF matching impedance and the gain matching impedance are able to be made close to each other. To be specific, the NF matching impedances ("NF_min_A" and "NF_min_B" in the FIG. 3C) and the impedances ("Gain_max_A" and "Gain_max_B" in FIG. 3C) at which the gain is maximum are able to be made close to each other as illustrated in FIG. 3C by adjusting the impedances (Z(LNAin+ADJ_A) and Z(LNAin+ADJ_B)) to be inductive as illustrated in FIG. 3B. This is capable of further increasing the gain while further suppressing the deterioration in the NF.

Moreover, with the high-frequency module 1 in the present preferred embodiment, by configuring the connection circuit (switch 20 in the present preferred embodiment) by the switch element, when any one of the plurality of selection terminals is connected to the common terminal, the plurality of paths in which the plurality of filters 10A to 10C are provided are not connected to one another. Therefore, this configuration is able to enhance isolation among the plurality of filters 10A to 10C.

The common terminal of the switch 20 may be connected to two or more selection terminals of the plurality of selection terminals.

Furthermore, with the high-frequency module 1 in the present preferred embodiment, the plurality of filters 10A to 10C include the elastic wave resonators and are thus reduced in size, thus further reducing the high-frequency module 1 in size. The plurality of filters 10A to 10C include the elastic wave resonators having generally high Q characteristics, thus reducing losses of the plurality of filters 10A to 10C. Accordingly, the gain is increased while suppressing the deterioration in the NF for the overall high-frequency module.

First Variation

In the above-described preferred embodiment, the switch 20 has been described as an example of the connection circuit that commonly connects the plurality of paths 10a to 10c. The connection circuit is not however limited to have this configuration and may be configured by a multiplexer, for example. As a high-frequency module according to a first variation of the present preferred embodiment, such a high-frequency module is described. In this variation and each of subsequent variations, description of the same configurations as those in the above-described preferred embodiment is omitted.

Figure 5:
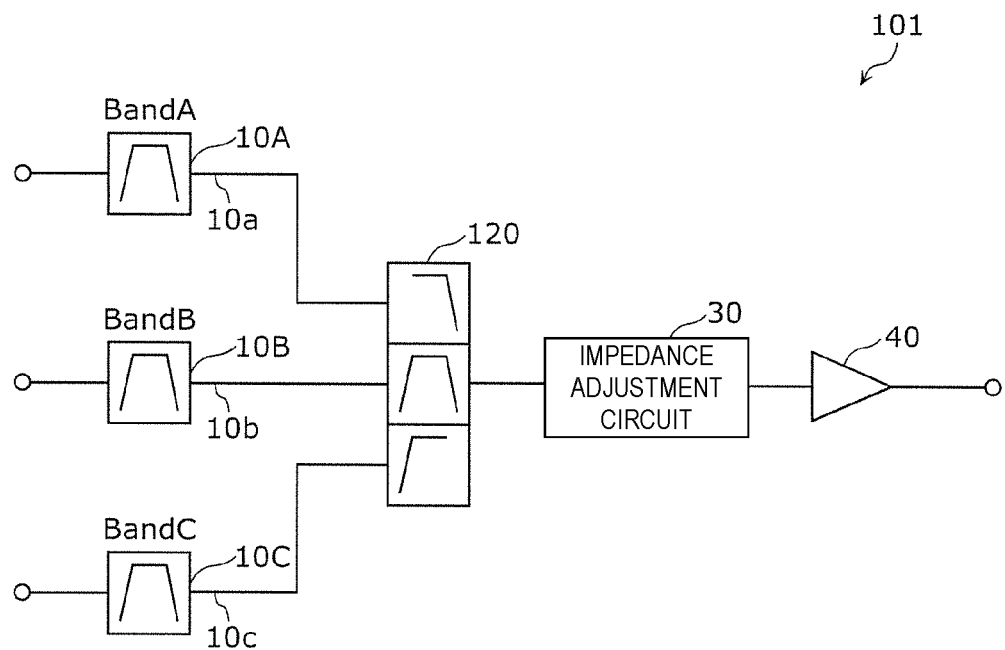
FIG. 5 is a circuit configuration diagram of a high-frequency module according to a first variation of a preferred embodiment of the present invention.

FIG. 5 is a circuit configuration diagram of a high-frequency module 101 in the first variation of the preferred embodiment.

The high-frequency module 101 illustrated in FIG. 5 is different from the high-frequency module 1 illustrated in FIG. 1 in the point that it includes a multiplexer 120 instead of the switch 20.

The multiplexer 120 includes a first terminal connected to the low noise amplifier 40 and a plurality of second terminals connected to the plurality of filters 10A to 10C in an individual correspondence manner. To be specific, the multiplexer 120 is a connection circuit including a plurality of individual terminals connected to the plurality of filters 10A to 10C in the individual correspondence manner and a common terminal connected to the low noise amplifier 40. Specifically, the multiplexer 120 includes a plurality of filters that are individually connected to a plurality of paths connecting the plurality of individual terminals and the common terminal. In the variation, the multiplexer 120 includes a low pass filter connected to the path connecting the individual terminal (one of the plurality of second terminals) connected to the path 10a and the common terminal (first terminal) and covering Band A in its pass band, a band pass filter connected to the path connecting the individual terminal (another one of the plurality of second terminals) connected to the path 10b and the common terminal (first terminal) and covering Band B in its pass band, and a high pass filter connected to the path connecting the individual terminal (still another one of the plurality of second terminals) connected to the path 10c and the common terminal (first terminal) and covering Band C in its pass band. The configuration of the multiplexer 120 is not limited thereto and may be configured by a plurality of band pass filters, for example. It should be noted that the number of common terminals (first terminals) is not limited to one and a plurality of common terminals may be provided.

Even with the above-described configuration, the high-frequency module 101 that is capable of increasing a gain while suppressing deterioration in an NF, is reduced in size, and is compatible with multiple bands is able to be provided in the same manner as the first preferred embodiment.

Furthermore, with the high-frequency module 101 in the variation, two or more high-frequency signals after passing through two or more filters among the plurality of filters are able to be transmitted simultaneously by configuring the connection circuit by the multiplexer 120. Therefore, the high-frequency module is able to be applied to CA (carrier aggregation) in which transmission and reception are performed using two or more bands of the plurality of bands simultaneously.

In general, insertion loss of the multiplexer is lower than that of the switch. With this variation, the gain is therefore able to be further increased while further suppressing the deterioration in the NF for the overall high-frequency module 101 in comparison with the configuration in which the switch is provided as the connection circuit.

Second Variation

In the above-described preferred embodiment and the first variation thereon, one circuit element (switch 20 in the above-described preferred embodiment and multiplexer 120 in the first variation of the above-described preferred embodiment) has been described as the example of the connection circuit that commonly connects the plurality of paths 10a to 10c. The connection circuit is not however limited to have this configuration and may be configured by connecting a plurality of circuit elements in a multistage arrangement. As a high-frequency module according to a second variation of the above-described preferred embodiment, such high-frequency modules are described.

Figure 6A:
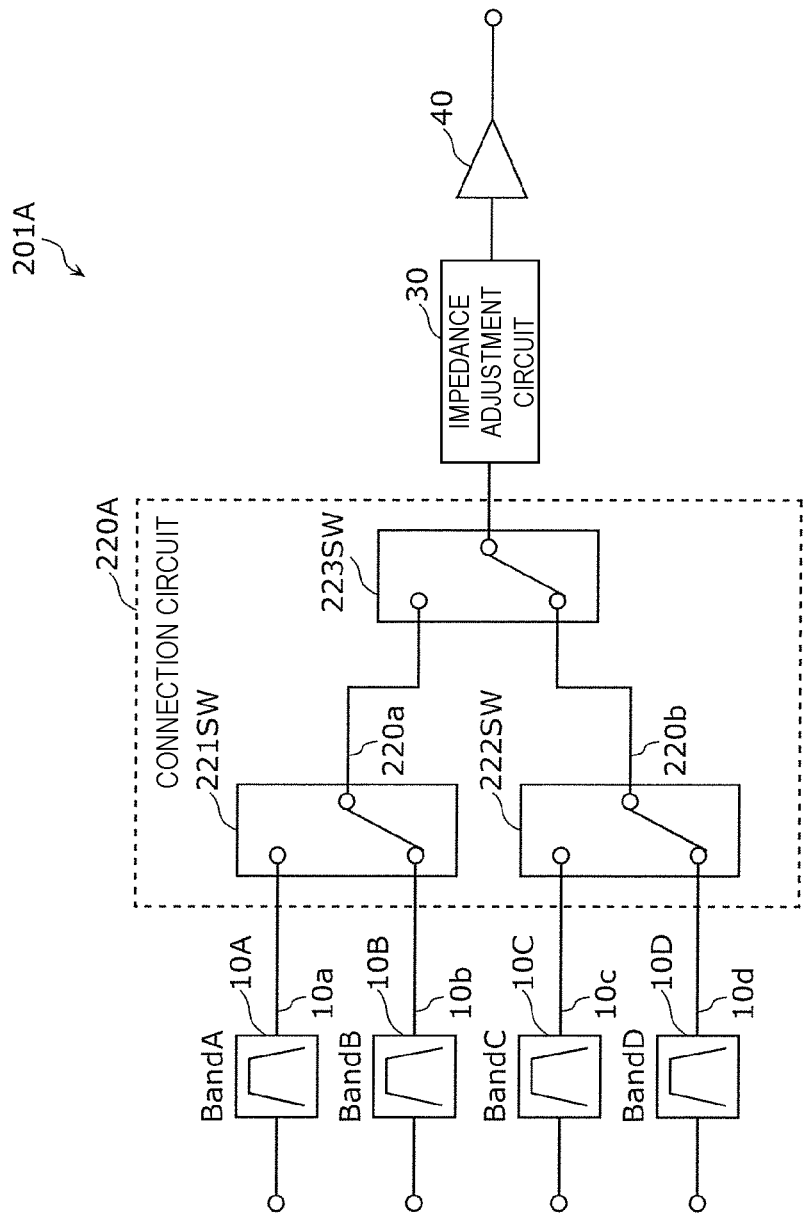
FIG. 6A is a circuit configuration diagram of a high-frequency module according to a first example of a second variation of a preferred embodiment of the present invention.
Figure 6B:
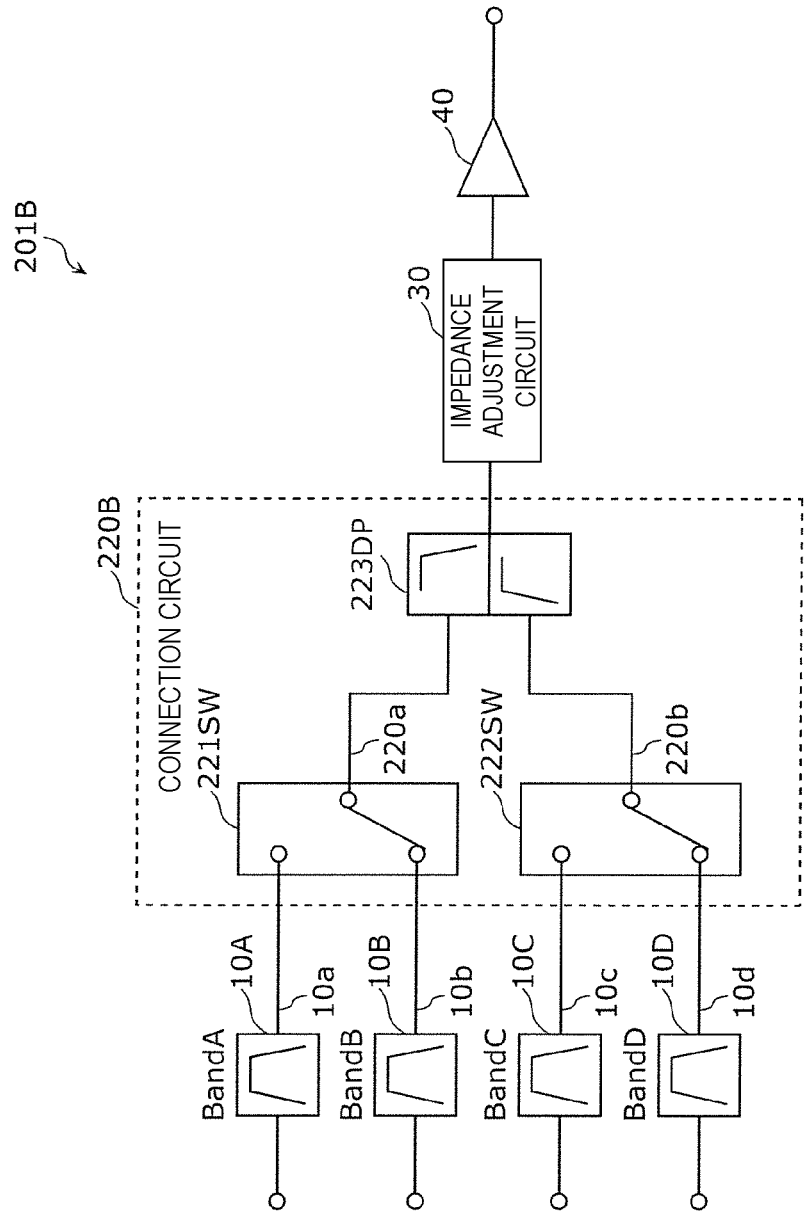
FIG. 6B is a circuit configuration diagram of a high-frequency module according to a second example of the second variation of a preferred embodiment of the present invention.
Figure 6C:
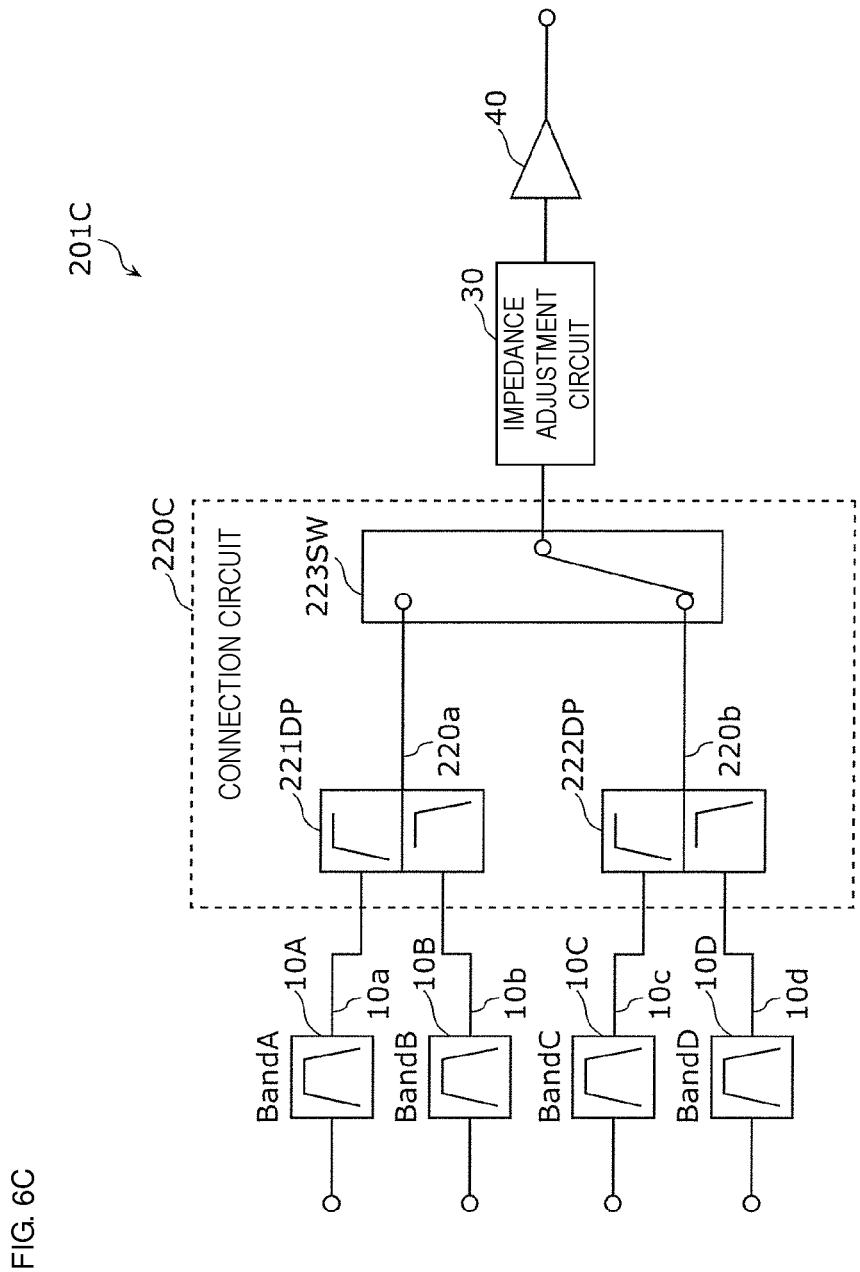
FIG. 6C is a circuit configuration diagram of a high-frequency module according to a third example of the second variation of a preferred embodiment of the present invention.

FIG. 6A is a circuit configuration diagram of a high-frequency module 201A according to a first example of the second variation of the above-described preferred embodiment. FIG. 6B is a circuit configuration diagram of a high-frequency module 201B according to a second example of the second variation of the above-described preferred embodiment. FIG. 6C is a circuit configuration diagram of a high-frequency module 201C according to a third example of the second variation of the above-described preferred embodiment.

As illustrated in FIG. 6A to FIG. 6C, all of the high-frequency modules 201A to 201C in the first to third examples of the variation include four filters 10A to 10D. The filters 10A to 10D have pass bands which are different from one another and Band D is assigned to the pass band of the filter 10D.

The high-frequency module 201A illustrated in FIG. 6A includes a connection circuit 220A including switches 221SW, 222SW, and 223SW.

The switch 221SW is a first initial stage connection circuit that commonly connects some paths (paths 10a and 10b in this example) among a plurality of paths 10a to 10d. That is to say, the switch 221SW commonly connects a portion of the plurality of paths 10a to 10d.

The switch 222SW is a second initial stage connection circuit that commonly connects at least two paths (paths 10c and 10d in this example), which are different from the above-described some paths, among the plurality of paths 10a to 10d. That is to say, the switch 222SW commonly connects at least another portion of the plurality of paths 10a to 10d.

The switch 223SW is a posterior stage connection circuit that is connected in a multistage arrangement to the first initial stage connection circuit (switch 221SW in this example) and the second initial stage connection circuit (switch 222SW in this example). The switch 223SW commonly connects a path 220a connected to a common terminal of the first initial stage connection circuit and a path 220b connected to a common terminal of the second initial stage connection circuit.

In the variation, each of the switches 221SW, 222SW, and 223SW is an SPDT (Single Pole Double Throw)-type switch element and a selection terminal thereof that is connected to the common terminal is switched with a control signal from a controller (not illustrated).

The high-frequency module 201B illustrated in FIG. 6B is different from the high-frequency module 201A illustrated in FIG. 6A in the point that it includes a connection circuit 220B including a diplexer 223DP instead of the switch 223SW.

The diplexer 223DP is a posterior stage connection circuit similar to the switch 223SW and includes a first terminal connected to the low noise amplifier 40 and a plurality of second terminals connected to the first initial stage connection circuit (switch 221SW in this example) and the second initial stage connection circuit (switch 222SW in this example) in an individual correspondence manner. To be specific, the diplexer 223DP includes a low pass filter covering Band A and Band B in its pass band and a high pass filter covering Band C and Band D in its pass band. The low pass filter is connected to a path connecting the individual terminal (one of the plurality of second terminals) connected to the path 220a and the common terminal (first terminal). The high pass filter is connected to a path connecting the individual terminal (the other one of the plurality of second terminals) connected to the path 220b and the common terminal (first terminal).

The high-frequency module 201C illustrated in FIG. 6C is different from the high-frequency module 201A illustrated in FIG. 6A in the point that it includes a connection circuit 220C including diplexers 221DP and 222DP instead of the switches 221SW and 222SW.

The diplexer 221DP is a first initial stage connection circuit similar to the switch 221SW and includes a first terminal connected to the posterior stage connection circuit (switch 223SW in this example) and a plurality of second terminals connected to the filters 10A and 10B in an individual correspondence manner. To be specific, the diplexer 221DP includes a low pass filter covering Band A in its pass band and a high pass filter covering Band B in its pass band. The low pass filter is connected to a path connecting the individual terminal (one of the plurality of second terminals) connected to the path 10a and the common terminal (first terminal). The high pass filter is connected to a path connecting the individual terminal (the other one of the plurality of second terminals) connected to the path 10b and the common terminal (first terminal).

The diplexer 222DP is a second initial stage connection circuit similar to the switch 222SW and includes a first terminal connected to the posterior stage connection circuit (switch 223SW in this example) and a plurality of second terminals connected to the filters 10C and 10D in an individual correspondence manner. To be specific, the diplexer 222DP includes a low pass filter covering Band C in its pass band and a high pass filter covering Band D in its pass band. The low pass filter is connected to a path connecting the individual terminal (one of the plurality of second terminals) connected to the path 10c and the common terminal (first terminal). The high pass filter is connected to a path connecting the individual terminal (the other one of the plurality of second terminals) connected to the path 10d and the common terminal (first terminal).

Even with the above-described configurations, the high-frequency modules 201A to 201C that are capable of increasing a gain while suppressing deterioration in an NF, are reduced in size, and are compatible with multiple bands are able to be provided in the same manner as the first preferred embodiment.

Each of the high-frequency modules 201A to 201C in the variation has the configuration of the connection circuit in which the circuits (first and second initial stage connection circuits and posterior stage connection circuit) are connected in a multistage arrangement, thus enhancing isolation among the plurality of filters.

Third Variation

In the above-described preferred embodiment and the first and second variations thereon, all of the paths in which the plurality of filters are provided connect the respective filters and the connection circuit without connecting impedance elements. Alternatively, there may be a path that connects the filter and the connection circuit with the impedance element connected therebetween. As a high-frequency module according to a third variation of the above-described preferred embodiment, such a high-frequency module is described.

Although in the variation, two filters to which Band A or Band B is assigned to their pass bands are described as examples of the first and second filters and a filter to which Band C is assigned to its pass band is described as an example of the third filter, a correspondence relationship between the first to third filters and these filters is not limited thereto.

Figure 7:
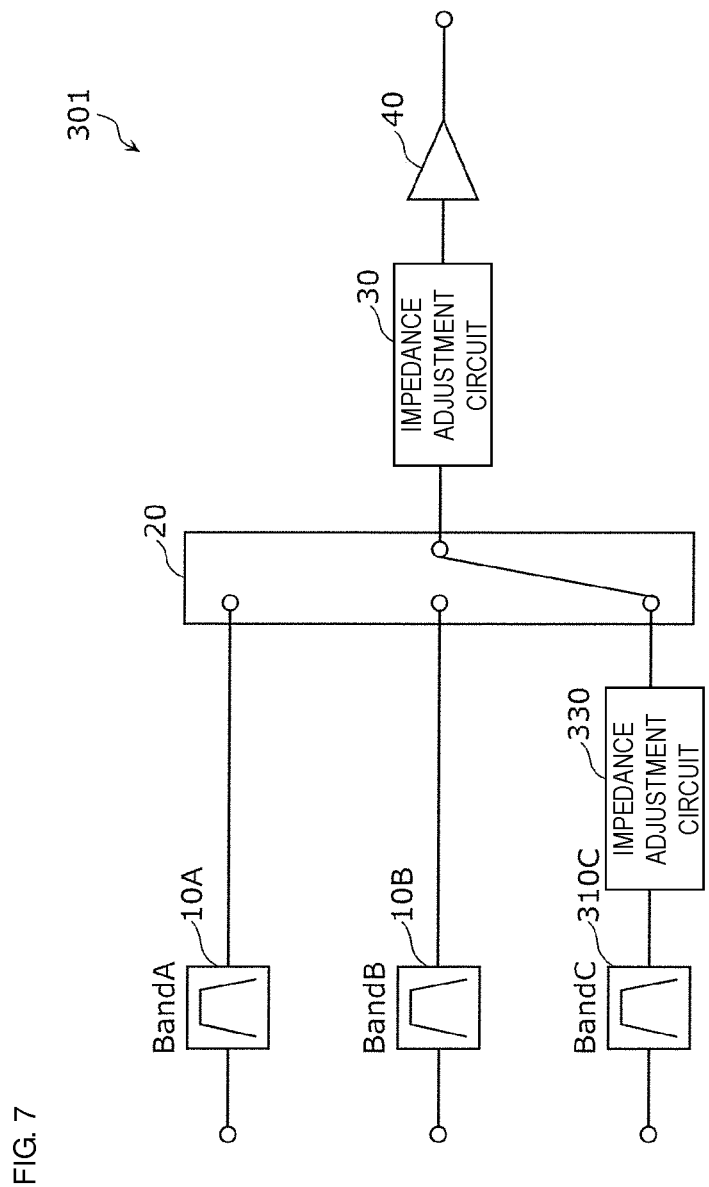
FIG. 7 is a circuit configuration diagram of a high-frequency module according to a third variation of a preferred embodiment of the present invention.

FIG. 7 is a circuit configuration diagram of a high-frequency module 301 in the third variation of the above-described preferred embodiment.

The high-frequency module 301 illustrated in FIG. 7 is different from the high-frequency module 1 illustrated in FIG. 1 in the point that it includes a filter 310C instead of the filter 10C and an impedance adjustment circuit 330 connected between the filter 310C and the switch 20.

The pass band of the filter 310C is largely different from those of the filters 10A and 10B (for example, by equal to or larger than the band width of the pass band). For example, the pass band of the filter 310C is in an LB band and the pass bands of the filters 10A and 10B are in an MB band. For example, the output impedance (in-band output impedance) of the filter 310C in its respective pass band is largely different from the output impedances (out-of-band impedances) thereof in the pass bands of the filters 10A and 10B.

The impedance adjustment circuit 330 is a functional circuit that is connected between the third filter (filter 310C in the variation) among the plurality of filters 10A, 10B, and 310C and the switch 20 and is configured or programmed to perform a predetermined function (function of adjusting the impedance in this example). The impedance adjustment circuit 330 is a second impedance adjustment circuit that generates a second impedance when a circuit portion in which the impedance adjustment circuit 330 is connected to the third filter is seen from the input side of the low noise amplifier 40 close to a matching region in the pass band of the third filter on the Smith chart. The circuit configuration of the impedance adjustment circuit 330 and a constant of an impedance element are not particularly limited and it is sufficient that the circuit configuration and the constant are set to cause the second impedance to be located in the above-described matching region.

Even with the above-described configuration, the high-frequency module 301 that is capable of increasing a gain while suppressing deterioration in an NF, is reduced in size, and is compatible with multiple bands is able to be provided in the same manner as the first preferred embodiment.

As described in the above-described preferred embodiment, the impedance adjustment circuit 30 adjusts the position of the matching region that increases the gain while suppressing the deterioration in the NF on the Smith chart. The impedance adjustment circuit 30 cannot enlarge the matching region although it can adjust the position of the matching region. Therefore, when the frequencies of the plurality of bands (Band A to Band C in this variation) are separated from one another, the effect of increasing the gain while suppressing the deterioration in the NF is difficult to be exerted in, in particular, the band (Band C in this variation) the frequency of which is separated from those of the other bands in some cases. As a combination of Band A to Band C, a combination of Bands 12, 13, and 7 of 3GPP (Third Generation Partnership Project) that is used in LTE (Long Term Evolution) is exemplified.

To cope with this problem, the high-frequency module 301 in the variation includes the impedance adjustment circuit (second impedance adjustment circuit) and is thus able to significantly improve or optimize balance between NF performance and gain performance for each of the first to third filters even when the frequency intervals of the pass band of the third filter (filter 310 in the variation) and the pass bands of the first and second filters (filters 10A and 10B in the variation) are largely separated from each other. Therefore, the plurality of bands with which the high-frequency module is compatible is able to be further widened.

Fourth Variation

The configuration in the second variation of the above-described preferred embodiment and the configuration of the third variation of the above-described preferred embodiment may be combined. That is to say, the connection circuit may include an impedance adjustment circuit connected between the first initial stage connection circuit and the posterior stage connection circuit. As a high-frequency module according to a fourth variation of the above-described preferred embodiment, such a high-frequency module is described.

Figure 8:
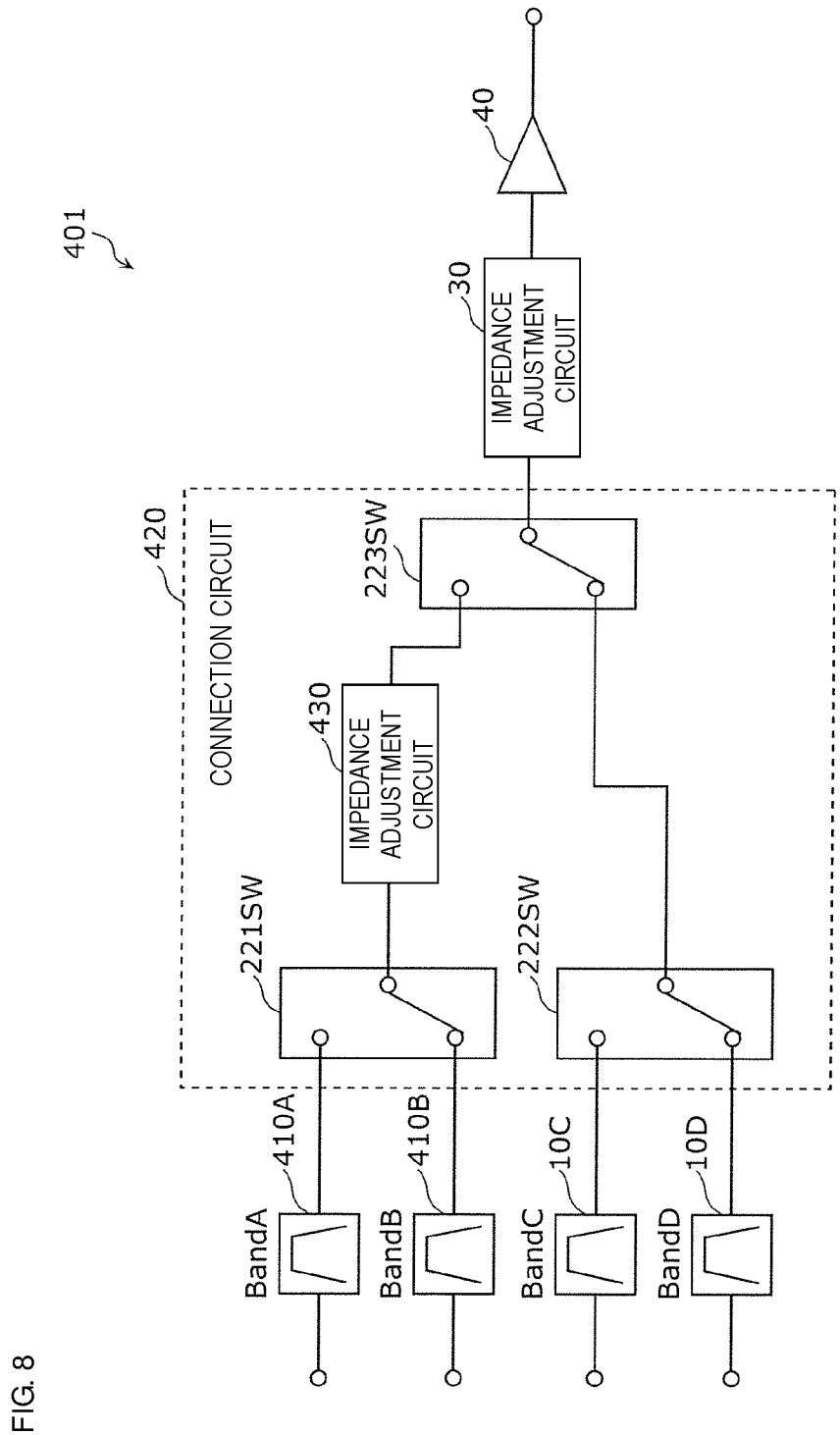
FIG. 8 is a circuit configuration diagram of a high-frequency module according to a fourth variation of a preferred embodiment of the present invention.

FIG. 8 is a circuit configuration diagram of a high-frequency module 401 in the fourth variation of the above-described preferred embodiment.

The high-frequency module 401 illustrated in FIG. 8 is different from the high-frequency module 201A illustrated in FIG. 6A in the point that it includes filters 410A and 410B instead of the filters 10A and 10B and further includes an impedance adjustment circuit 430.

The filters 410A and 410B have output impedances Z(Fout_A) and Z(Fout_B) located in different regions from a matching region in their respective pass bands on the Smith chart.

The impedance adjustment circuit 430 is a third impedance adjustment circuit that is connected between the first initial stage connection circuit (switch 221SW in the variation) and the posterior stage connection circuit (switch 223SW in the variation). The impedance adjustment circuit 430 generates a third impedance when a circuit portion in which the impedance adjustment circuit 430 is connected to the first initial stage connection circuit is seen from the input side of the low noise amplifier 40 close to the above-described matching region in the pass bands of some filters (filters 410A and 410B in the variation) provided in some paths (paths that are commonly connected by the first impedance adjustment circuit) among the plurality of filters 410A, 410B, 10C, and 10D on the Smith chart. The circuit configuration of the impedance adjustment circuit 430 and a constant of an impedance element are not particularly limited and it is sufficient that the circuit configuration and the constant are set to cause the third impedance to be located in the above-described matching region.

Even with the above-described configuration, the high-frequency module 401 that is capable of increasing a gain while suppressing deterioration in an NF, is reduced in size, and is compatible with multiple bands is able to be provided in the same manner as the first preferred embodiment.

With the high-frequency module 401 in the variation, the connection circuit 420 includes the impedance adjustment circuit 430 (third impedance adjustment circuit), thus providing the following effects.

The frequency bands of the bands assigned to the some filters (filters 410A and 410B in the variation) provided in the some paths which are commonly connected by the switch 221SW (first initial stage connection circuit) among the plurality of bands with which the high-frequency module 401 is compatible are referred to as a first frequency band. The frequency bands of the bands assigned to at least two filters (filters 10C and 10D in the variation) provided in at least two paths which are commonly connected by the switch 222SW (second initial stage connection circuit) among the plurality of bands with which the high-frequency module 401 is compatible are referred to as a second frequency band.

By including the impedance adjustment circuit 430 as described above, balance between NF performance and gain performance are able to be significantly improved or optimized for each of the above-described some filters and the above-described at least two filters even when the frequency intervals of the first frequency band and the second frequency band are largely separated from each other. Therefore, the high-frequency module 401 is able to be compatible with a large number of bands having largely different frequencies in the plurality of bands with which the high-frequency module 401 is compatible. The bands having the largely different frequencies indicate bands the frequencies of which are largely different, such as an HB band (for example, band of about 2.5 GHz) and an MB band (for example, band of about 1800 MHz).

In the variation, the filters 410A and 410B have been described as the examples of the filters that are connected to the impedance adjustment circuit 430. The filters that are connected to the impedance adjustment circuit 430 are not however limited to the above-described example and may be, for example, the filters 10C and 10D. That is to say, the impedance adjustment circuit 430 may be connected between the switch 222SW and the switch 223SW. In this case, the switch 222SW corresponds to the first initial stage connection circuit and the switch 221SW corresponds to the second initial stage connection circuit.

Fifth Variation

In the above-described preferred embodiment and the first to fourth variations thereon, the connection circuit (or the first and second initial stage connection circuits and the posterior stage connection circuit configuring the connection circuit) connects the plurality of paths with the circuit elements such as the switches (the multiplexers or the diplexers). The connection circuit is not however limited to the circuit element and may be a connection point that commonly connects the plurality of paths (wirings). In this case, one impedance adjustment circuit may include an impedance adjustment circuit connected at a previous stage (filter side) of the connection point and an impedance adjustment circuit connected at a subsequent stage (LNA side) thereof. As a high-frequency module according to a fifth variation of the present preferred embodiment, such a high-frequency module is described.

Figure 9:
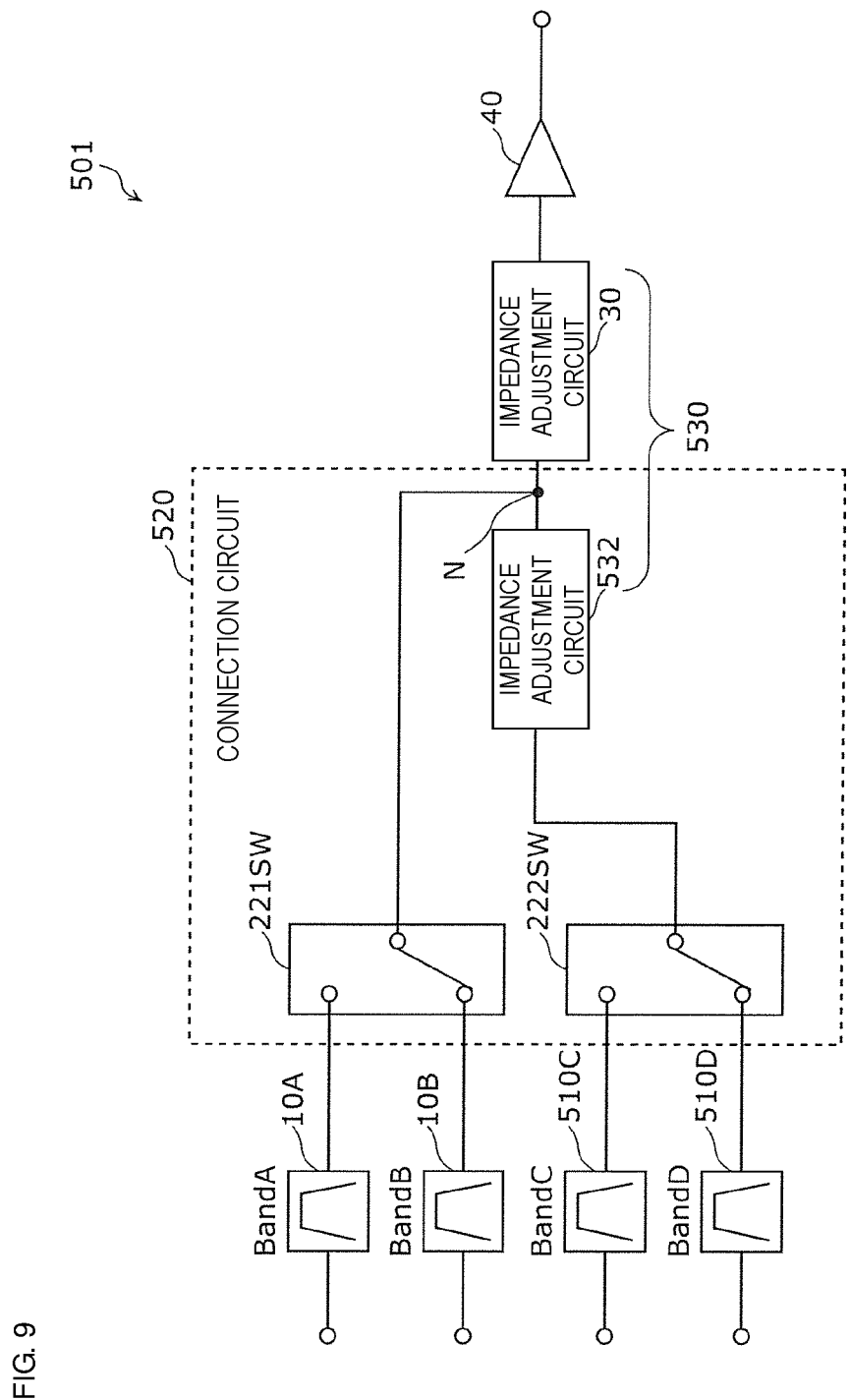
FIG. 9 is a circuit configuration diagram of a high-frequency module according to a fifth variation of a preferred embodiment of the present invention.

FIG. 9 is a circuit configuration diagram of a high-frequency module 501 in the fifth variation of the present preferred embodiment.

The high-frequency module 501 illustrated in FIG. 9 is different from the high-frequency module 401 illustrated in FIG. 8 in the point that it includes filters 10A and 10B instead of the filters 410A and 410B and filters 510C and 510D instead of the filters 10C and 10D. Furthermore, a connection circuit 520 of the high-frequency module 501 is different from the connection circuit 420 of the high-frequency module 401 in the points that the posterior stage connection circuit includes a branch point N (branch portion) and an impedance adjustment circuit 532 (third impedance adjustment circuit) is provided in a path connecting the posterior stage connection circuit and the switch 222SW.

The pass bands of the filters 510C and 510D are largely different from those of the filters 10A and 10B (for example, by equal to or larger than the band width of the pass band). For example, the pass bands of the filters 510C and 510D are in an LB band and the pass bands of the filters 10A and 10B are in an MB band. For example, the output impedances (in-band output impedances) of the respective filters 510C and 510D in their respective pass bands are largely different from the output impedances (out-of-band impedances) thereof in the pass bands of the filters 10A and 10B.

The impedance adjustment circuit 532 is a third impedance adjustment circuit that is connected between the first initial stage connection circuit (switch 222SW in the variation) and the posterior stage connection circuit (branch point N in the variation). The impedance adjustment circuit 532 adjusts a third impedance when a circuit portion in which the impedance adjustment circuit 532 is connected to the first initial stage connection circuit is seen from the input side of the low noise amplifier 40 to be located in the above-described matching region in the pass bands of the filters (filters 510C and 510D in the variation) connected to the first initial stage connection circuit on the Smith chart.

That is to say, the impedance adjustment circuit 532 provides one impedance adjustment circuit 530 together with the impedance adjustment circuit 30. In other words, as for the impedance adjustment circuit 530, when the point at the low noise amplifier 40 side is assumed to be a start point, the switch 222SW is connected to an end point and the switch 221SW is connected to the branch point N between the start point and the end point. Therefore, the one impedance adjustment circuit 530 including these two impedance adjustment circuits performs two functions of moving the matching region for the filters 10A and 10B and moving the matching region for the filters 510C and 510D.

Even with the above-described configuration, the high-frequency module 501 that is capable of increasing a gain while suppressing deterioration in an NF, is reduced in size, and is compatible with multiple bands is able to be provided in the same manner as the first preferred embodiment.

The high-frequency module 501 in the variation is able to have the simplified configuration by providing the posterior stage connection circuit with the branch point N (branch portion). Moreover, this configuration enables the high-frequency module to be applied to carrier aggregation in which transmission and reception are performed using two or more bands of the plurality of bands simultaneously.

Sixth Variation

In the above-described preferred embodiment and the first to fifth variations thereon, the high-frequency module preferably includes one impedance adjustment circuit 30 (first impedance adjustment circuit) and one low noise amplifier 40. It should be noted that the numbers of them are not limited to one and a plurality of them may be provided. As a high-frequency module according to a sixth variation of the above-described preferred embodiment, such a high-frequency module is described.

Figure 10:
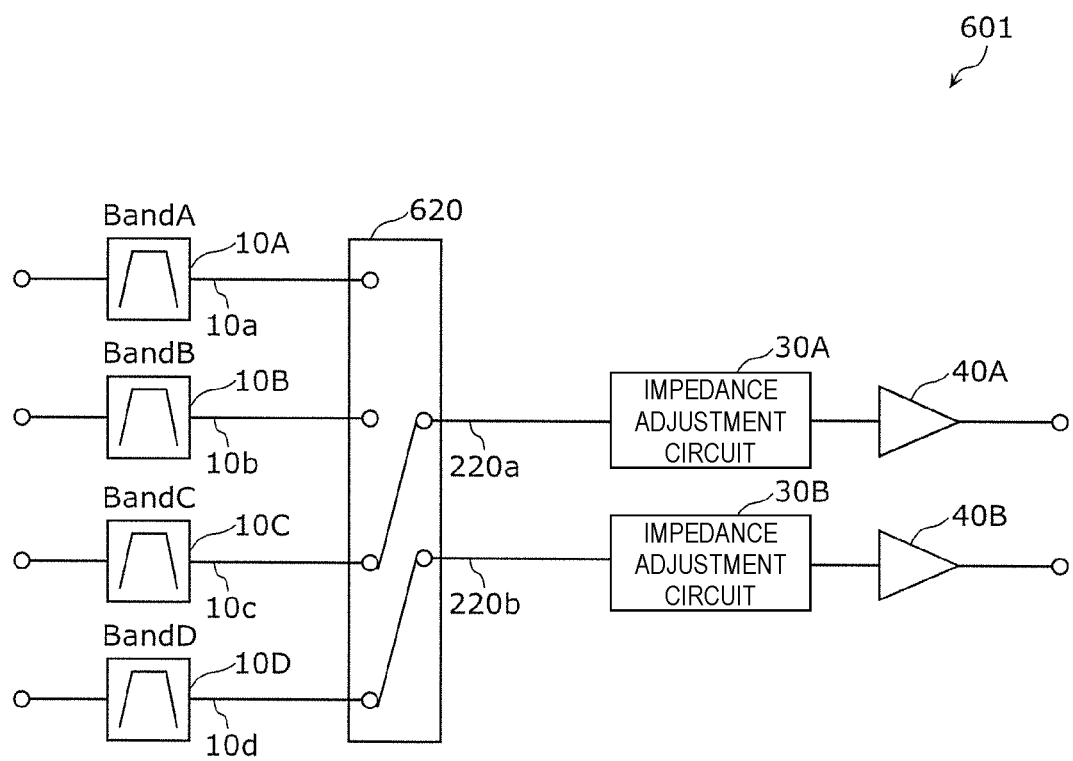
FIG. 10 is a circuit configuration diagram of a high-frequency module according to a sixth variation of a preferred embodiment of the present invention.

FIG. 10 is a circuit configuration diagram of a high-frequency module 601 in the sixth variation of the above-described preferred embodiment.

The high-frequency module 601 illustrated in FIG. 10 is different from the high-frequency module 1 illustrated in FIG. 1 in the point that it includes two impedance adjustment circuits 30A and 30B and two low noise amplifiers 40A and 40B instead of the impedance adjustment circuit 30 and the low noise amplifier 40. Furthermore, the high-frequency module 601 includes a DPnT (Double Pole n Throw)-type (n is the number of filters and four in the variation) switch 620 instead of the SPnT-type switch 20. A selection terminal of the switch 620, which is connected to each common terminal, is switched with a control signal from a controller (not illustrated).

With this configuration, for example, the low noise amplifier 40A is able to amplify a high-frequency signal (high-frequency reception signal) of an HB band and the low noise amplifier 40B is able to amplify a high-frequency signal (high-frequency reception signal) of an LB band. Accordingly, the appropriate low noise amplifier is able to be used for each of the HB band and the LB band, thus increasing a gain while suppressing deterioration in an NF and further widening the plurality of bands with which the high-frequency module 601 is compatible.

This configuration enables the high-frequency module to be applied to carrier aggregation in which transmission and reception are performed using two or more bands of the plurality of bands simultaneously.

In the variation, the numbers of impedance adjustment circuits and low noise amplifiers are not limited to the above-mentioned numbers and may be three or more. With this configuration, the switch 620 is not limited to be of the DPnT type and the same number of common terminals as those of impedance adjustment circuits and low noise amplifiers may be provided.

Seventh Variation

Although in the first example of the second variation of the above-described preferred embodiment, the switch 221SW and the switch 222SW include the individual switch elements, they may be configured by one switch element. That is to say, one initial stage connection circuit and one posterior stage connection circuit may be provided. As a high-frequency module according to a seventh variation of the above-described preferred embodiment, such a high-frequency module is described.

Figure 11:
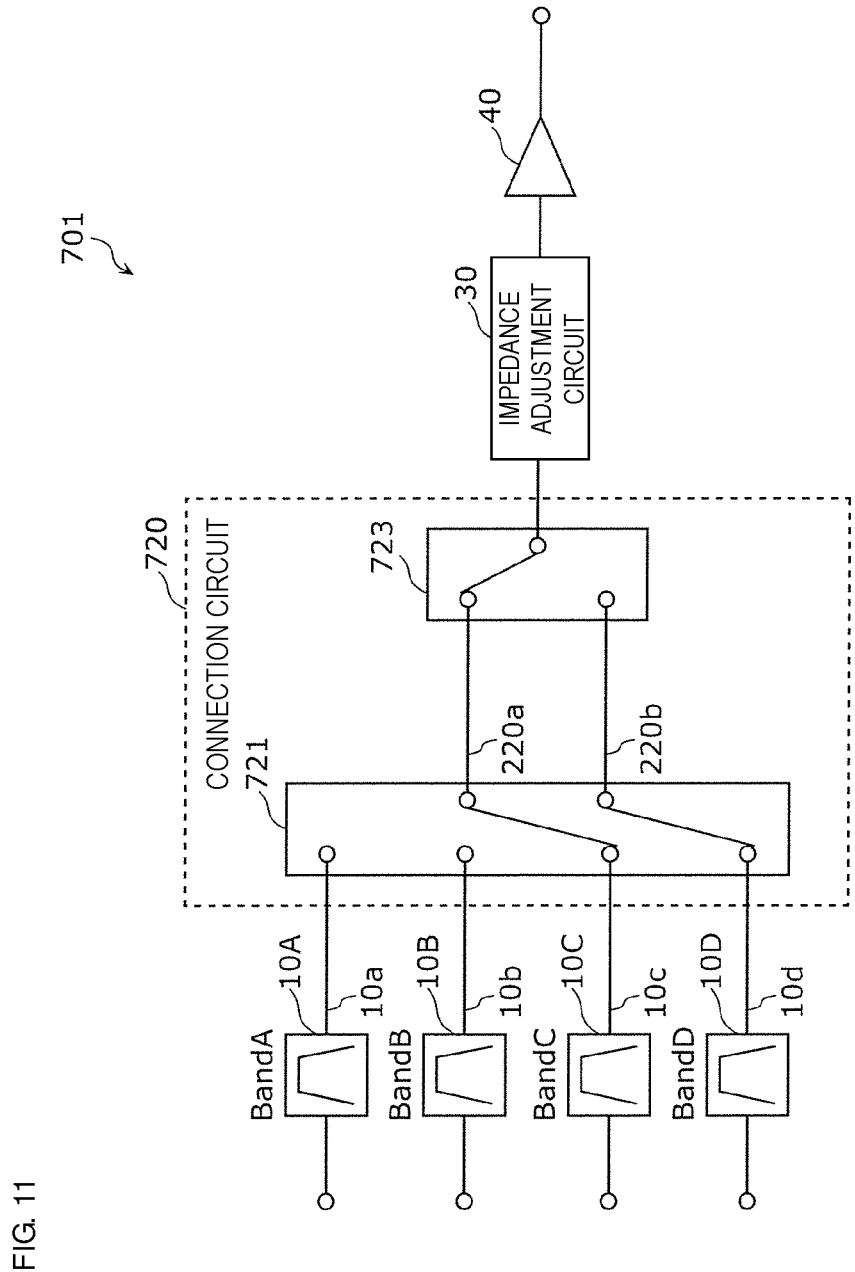
FIG. 11 is a circuit configuration diagram of a high-frequency module according to a seventh variation of a preferred embodiment of the present invention.

FIG. 11 is a circuit configuration diagram of a high-frequency module 701 in the seventh variation of the above-described preferred embodiment.

The high-frequency module 701 illustrated in FIG. 11 is different from the high-frequency module 201A illustrated in FIG. 6A in the point that it includes a connection circuit 720 including a switch 721 and a switch 723 instead of the connection circuit 220A including the switches 221SW and 222SW and the switch 223SW. It should be noted that the switch 723 has the same configuration as that of the switch 223SW and description thereof is therefore omitted below.

The switch 721 is a switch in which the switch 221SW (first initial stage connection circuit) and the switch 222SW (second initial stage connection circuit) are integrated and is a DPnT-type (n is the number of filters and four in the variation) switch in the variation. A selection terminal of the switch 721, which is connected to each common terminal, is switched with a control signal from a controller (not illustrated), in the same manner as the switch 620.

Even with this configuration, the same effects as those provided in the first example of the second variation of the above-described preferred embodiment are able to be provided.

It should be noted that the switch 723 is not limited to be of the SPDT type and may three or more selection terminals. With this configuration, the switch 721 is not limited to be of the DPnT type and may include the same number of common terminals as that of the selection terminals of the switch 723.

Eighth Variation

In the above-described preferred embodiment and the first to seventh variations thereon, the high-frequency module includes any circuit element as the connection circuit. The connection circuit may however include no circuit element and be configured by commonly connecting a plurality of paths. As a high-frequency module according to an eighth variation of the above-described preferred embodiment, such a high-frequency module is described.

Figure 12:
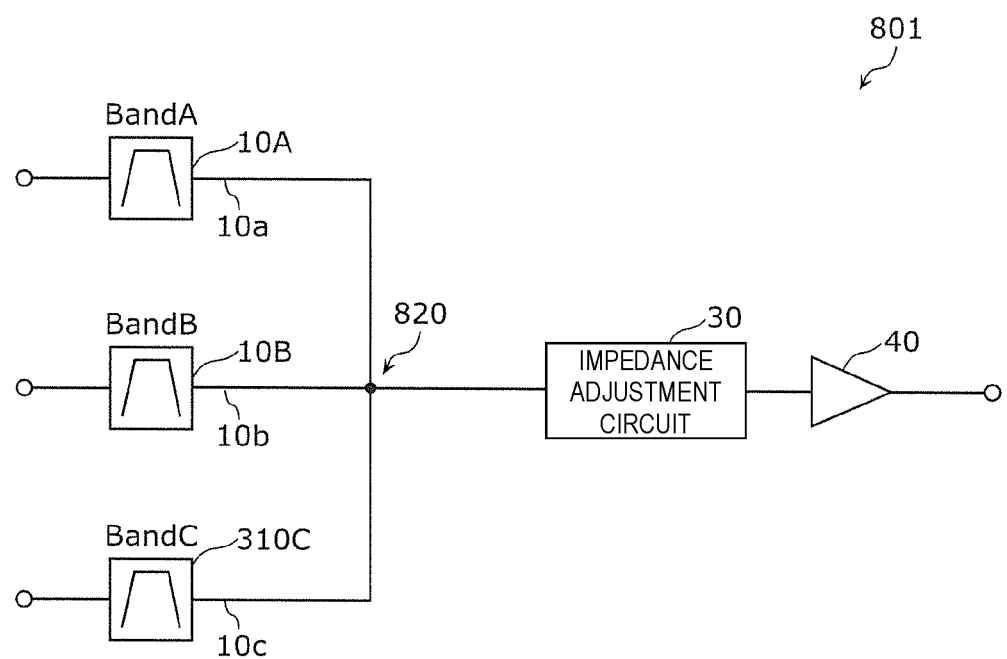
FIG. 12 is a circuit configuration diagram of a high-frequency module according to an eighth variation of a preferred embodiment of the present invention.

FIG. 12 is a circuit configuration diagram of a high-frequency module 801 in the eighth variation of the above-described preferred embodiment.

The high-frequency module 801 illustrated in FIG. 12 is different from the high-frequency module 1 illustrated in FIG. 1 in the point that the plurality of paths 10a to 10c are commonly connected at a common connection point 820 instead of the switch (connection circuit). That is to say, the common connection point 820 corresponds to a connection circuit in the variation.

This configuration reduces the connection circuit in size, thus further reducing the overall high-frequency module 801 in size.

Furthermore, this configuration enables the high-frequency module to be applied to CA (Carrier Aggregation) in which transmission and reception are performed using a plurality of bands simultaneously.

Ninth Variation

Figure 13A:
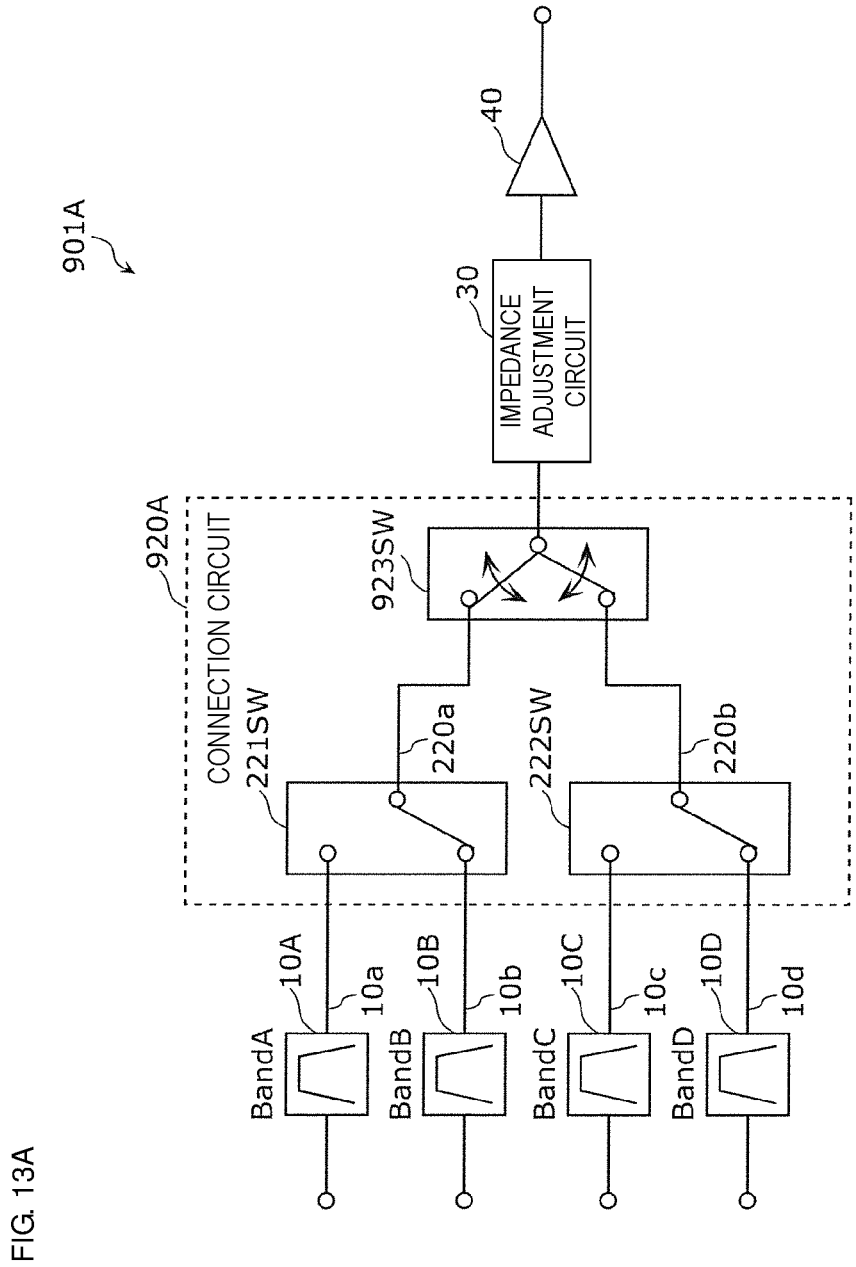
FIG. 13A is a circuit configuration diagram of a high-frequency module according to a first example of a ninth variation of a preferred embodiment of the present invention.
Figure 13B:
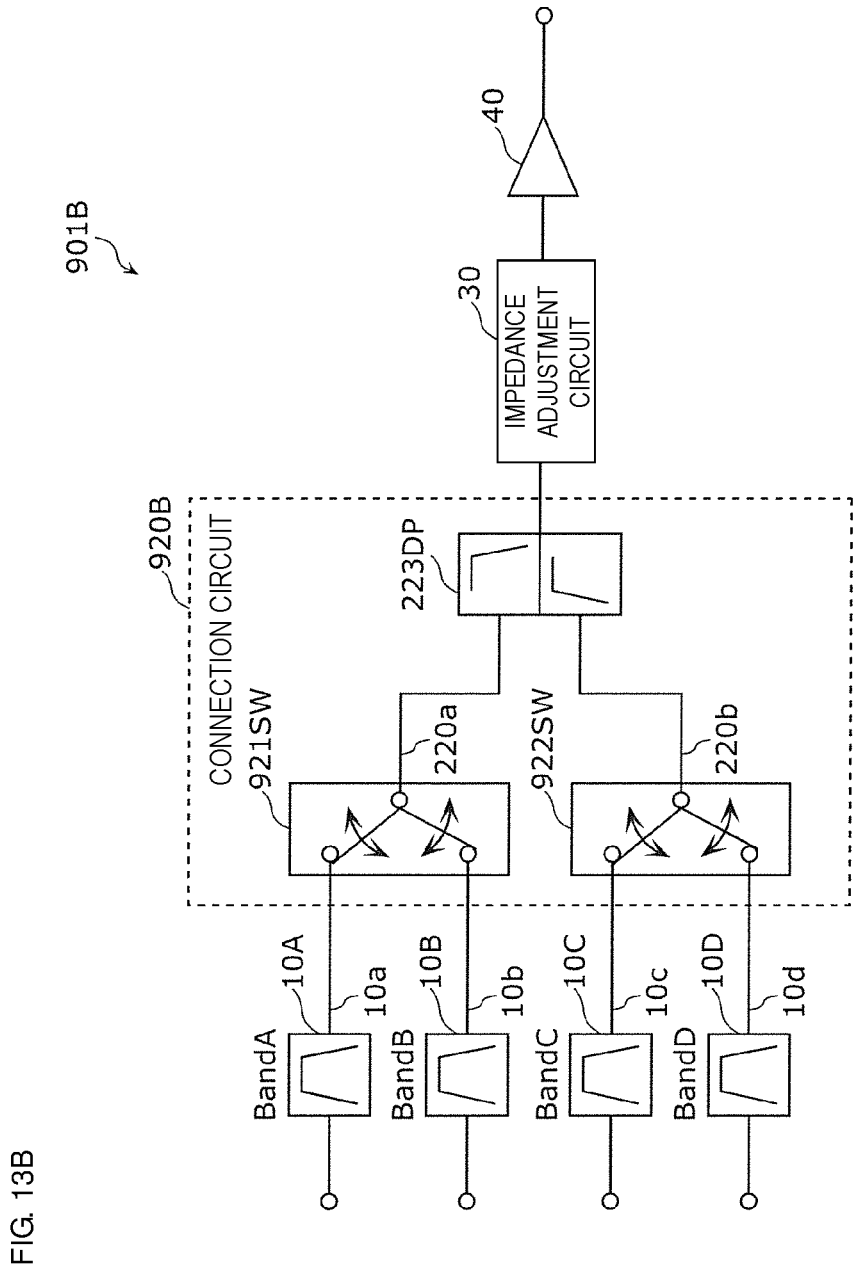
FIG. 13B is a circuit configuration diagram of a high-frequency module according to a second example of the ninth variation of a preferred embodiment of the present invention.
Figure 13C:
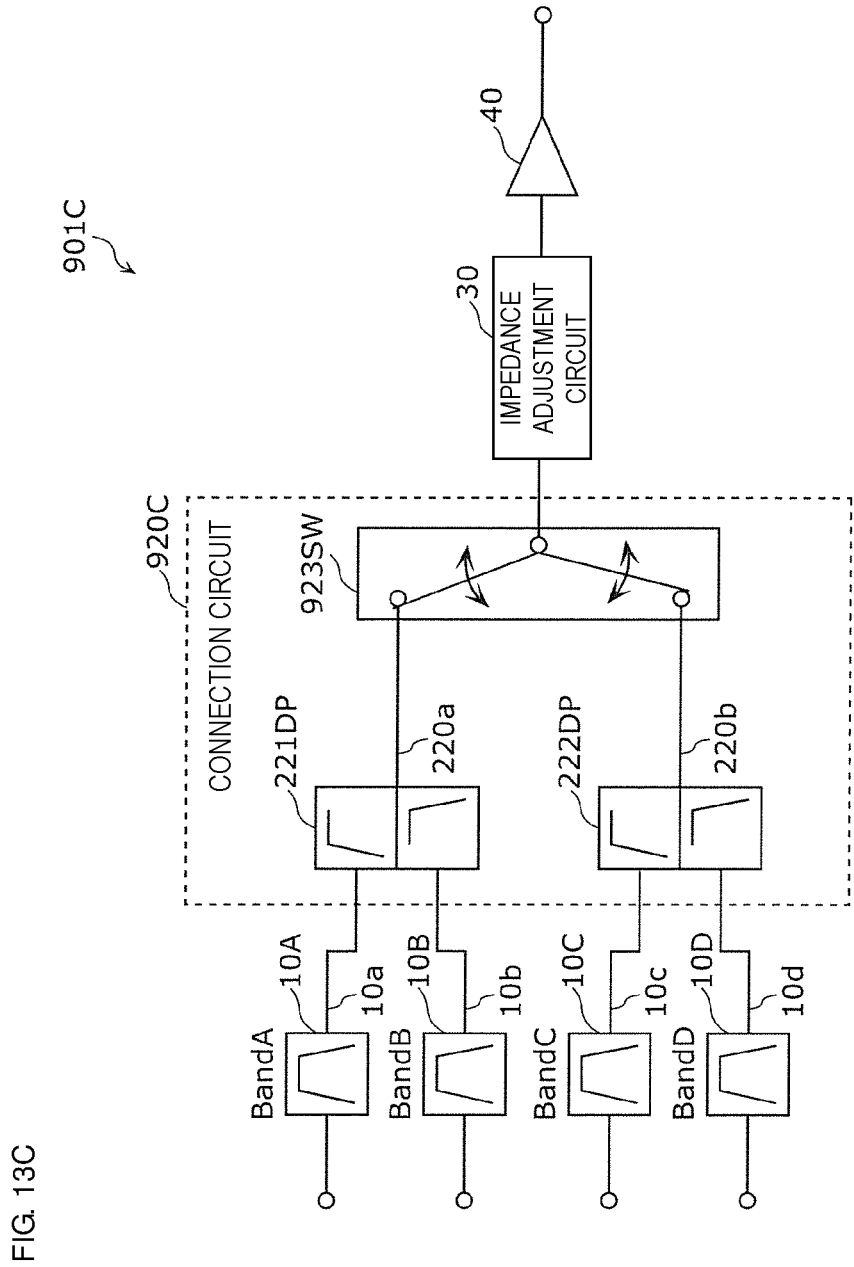
FIG. 13C is a circuit configuration diagram of a high-frequency module according to a third example of the ninth variation of a preferred embodiment of the present invention.

The configuration that is applied to CA is not limited to the above-described configuration and, for example, the configuration including a switch capable of connecting a common terminal to a plurality of individual terminals simultaneously may be provided. FIG. 13A is a circuit configuration diagram of a high-frequency module 901A according to a first example of the ninth variation of the above-described preferred embodiment. FIG. 13B is a circuit configuration diagram of a high-frequency module 901B according to a second example of the ninth variation of the above-described preferred embodiment. FIG. 13C is a circuit configuration diagram of a high-frequency module 901C according to a third example of the ninth variation of the above-described preferred embodiment.

The high-frequency module 901A illustrated in FIG. 13A is different from the high-frequency module 201A illustrated in FIG. 6A in the point that it includes a connection circuit 920A including a switch 923SW instead of the switch 223SW.

The switch 923SW is a switch capable of connecting a common terminal connected to the impedance adjustment circuit 30 to two individual terminals that are respectively connected to the two paths 220a and 220b simultaneously. Selection terminals of the switch 923W, which are connected to the common terminal, and the number thereof are switched with a control signal from a controller (not illustrated).

The high-frequency module 901A configured as described above is able to be compatible with CA with any one of Band A and Band B and any one of Band C and Band D by connecting the common terminal of the switch 923SW to the two individual terminals thereof simultaneously.

The high-frequency module 901B illustrated in FIG. 13B is different from the high-frequency module 201B illustrated in FIG. 6B in the point that it includes a connection circuit 920B including switches 921SW and 922SW instead of the switches 221SW and 222SW.

The switch 921SW is a switch capable of connecting a common terminal connected to the diplexer 223DP as the posterior stage connection circuit to two individual terminals that are respectively connected to the two paths 10a and 10b simultaneously. The switch 922SW is a switch capable of connecting a common terminal connected to the diplexer 223DP as the posterior stage connection circuit to two individual terminals that are respectively connected to the two paths 10c and 10d simultaneously. The switches 921SW and 922SW preferably are SPDT-type switches and selection terminals thereof, which are connected to the common terminals, and the numbers thereof are switched with a control signal from a controller (not illustrated).

The high-frequency module 901B configured as described above is able to be compatible with CA with two or more bands of Band A to Band D with at least one of the switches 921SW and 922SW.

The high-frequency module 901C illustrated in FIG. 13C is different from the high-frequency module 201C illustrated in FIG. 6C in the point that it includes a connection circuit 920C including the above-described switch 923SW instead of the switch 223SW.

The high-frequency module 901C configured as described above is able to be compatible with CA with two or more bands of Band A to Band D by connecting the common terminal of the switch 923SW to the two individual terminals thereof simultaneously.

Tenth Variation

The switch connecting the common terminal to the plurality of selection terminals simultaneously, which has been described in the ninth variation, may be used to adjust an impedance. As a high-frequency module according to a tenth variation of the above-described preferred embodiment, a high-frequency module including the above-described switch is described.

Figure 14:
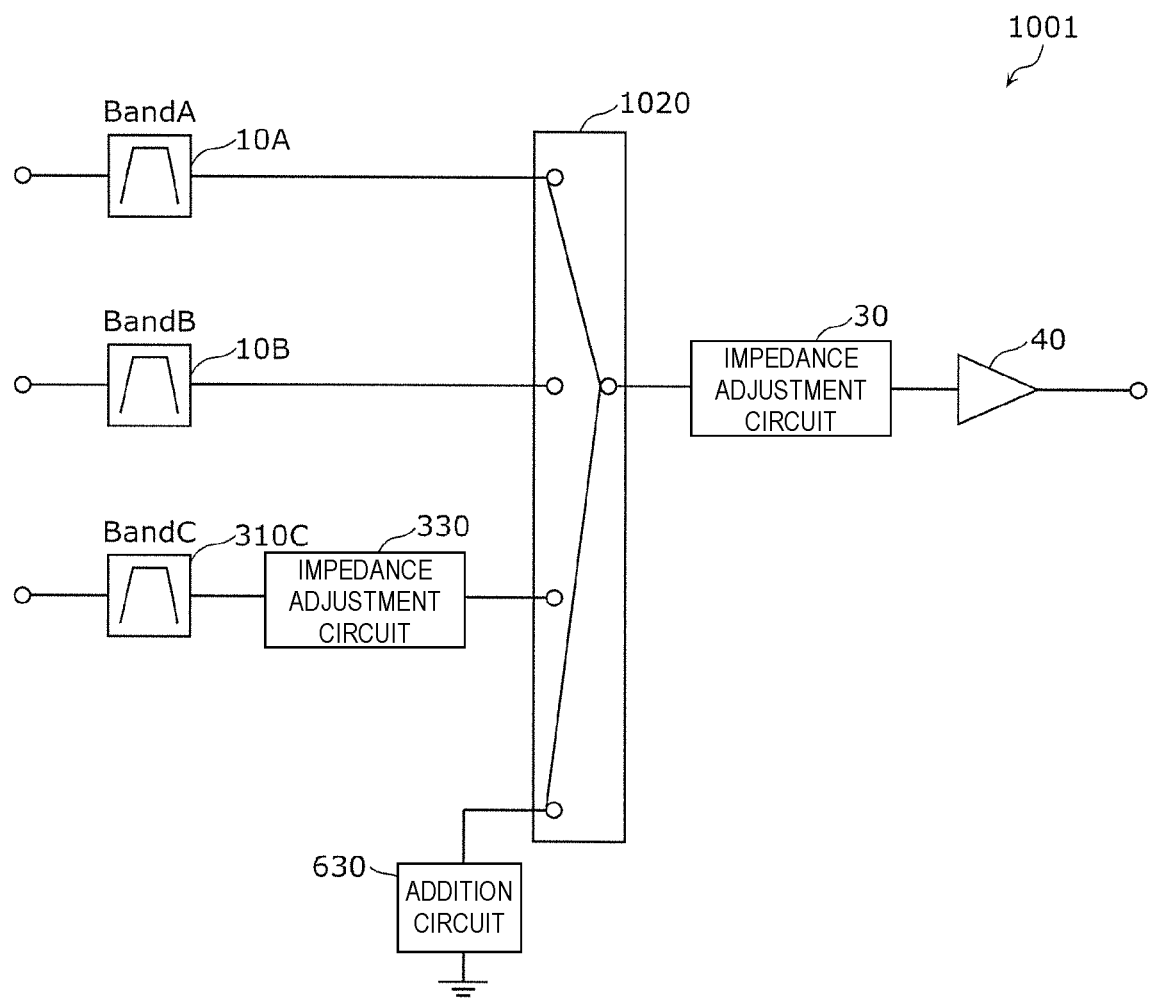
FIG. 14 is a circuit configuration diagram of a high-frequency module according to a tenth variation of a preferred embodiment of the present invention.

FIG. 14 is a circuit configuration diagram of a high-frequency module 1001 in the tenth variation of the above-described preferred embodiment.

The high-frequency module 1001 illustrated in FIG. 14 is different from the high-frequency module 301 illustrated in FIG. 7 in the point that it includes a switch 1020 instead of the switch and further includes an addition circuit 630 to adjust an impedance.

The switch 1020 is a switch including one common terminal and four individual terminals and capable of connecting the common terminal to two or more individual terminals among the four individual terminals simultaneously. Selection terminals of the switch 1020, which are connected to the common terminal, and the number thereof are switched with a control signal from a controller (not illustrated).

The addition circuit 630 is a circuit that is connected between one individual terminal of the switch 1020 and the ground and is configured or programmed to perform a predetermined function. That is to say, the addition circuit 630 plays the predetermined function by being connected between a main path that transmits a high-frequency signal and the ground when the common terminal of the switch 1020 is simultaneously connected to the individual terminal connected to the addition circuit 630 and another individual terminal.

The addition circuit 630 is, for example, an impedance element such as an inductor and a capacitor that is connected between the individual terminal of the switch 1020 and the ground. With the addition circuit 630 configured as described above, the impedance element adjusts the impedance of the main path by being connected between the main path and the ground when the common terminal of the switch 1020 is simultaneously connected in the above-described manner.

Furthermore, the addition circuit 630 is, for example, a resonance circuit such as an LC parallel resonance circuit, an LC series resonance circuit, or a distributed constant-type resonator, which is connected between the individual terminal of the switch and the ground. With the addition circuit 630 configured as described above, the resonance circuit generates a pole by being connected between the main path and the ground when the common terminal of the switch 1020 is simultaneously connected in the above-described manner. To be specific, the resonance circuit generates an attenuation pole at a frequency at which the impedance is minimum (0 ideally) and generates a pass band at a frequency at which the impedance is maximum (infinite ideally).

As described above, the high-frequency module 1001 in the variation switches presence or absence of the predetermined function that the addition circuit 630 plays by switching whether the common terminal of the switch 1020 is connected to the individual terminal to which the addition circuit 630 is connected while being connected to at least another individual terminal.

Eleventh Variation

The impedance adjustment circuit as described above may have the configuration capable of varying an impedance. As a high-frequency module according to an eleventh variation of the above-described preferred embodiment, a high-frequency module including the above-described impedance adjustment circuit is described.

Figure 15:
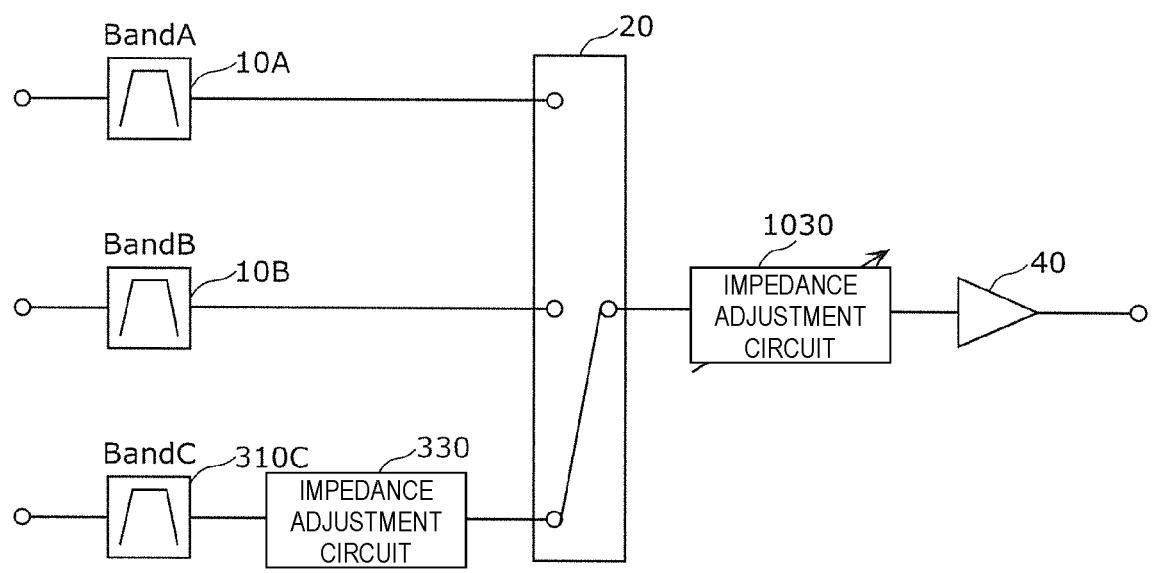
FIG. 15 is a circuit configuration diagram of a high-frequency module according to an eleventh variation of a preferred embodiment of the present invention.

FIG. 15 is a circuit configuration diagram of a high-frequency module 1101 in the eleventh variation of the above-described preferred embodiment.

The high-frequency module 1101 illustrated in FIG. 15 is different from the high-frequency module 301 illustrated in FIG. 7 in the point that it includes an impedance adjustment circuit 1030 capable of varying an impedance instead of the impedance adjustment circuit 30.

FIGS. 16A to 16D show examples of the impedance adjustment circuit 1030 according to the variation.

Figure 16A:
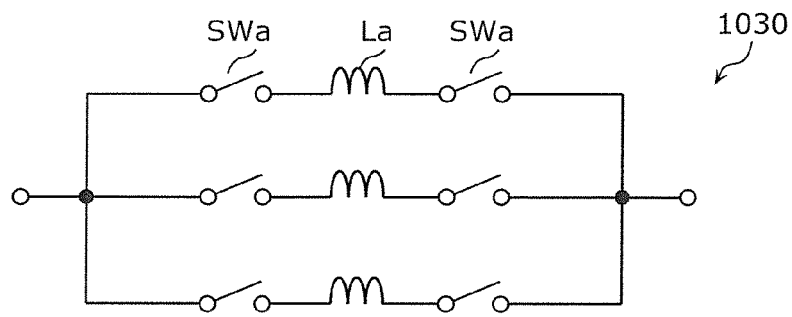
FIG. 16A is an example of an impedance adjustment circuit in the eleventh variation of a preferred embodiment of the present invention.

As illustrated in FIG. 16A, the impedance adjustment circuit 1030 may be configured by, for example, connecting in parallel a plurality of series circuits each of which includes an inductor La and a pair of switches SWa connected in series to both ends thereof. With this configuration, the inductors La connected in parallel are able to be switched by switching ON and OFF of each of the pairs of switches SWa, thus varying the inductance of the overall impedance adjustment circuit 1030.

Figure 16B:
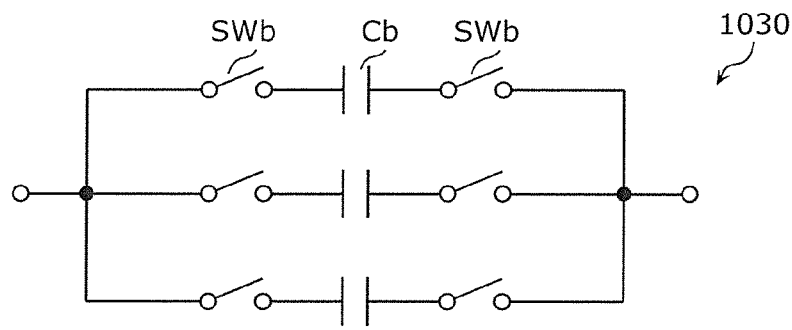
FIG. 16B is another example of the impedance adjustment circuit in the eleventh variation of a preferred embodiment of the present invention.

As illustrated in FIG. 16B, the impedance adjustment circuit 1030 may be provided by, for example, connecting in parallel a plurality of series circuits each of which includes a capacitor Cb and a pair of switches SWb connected in series to both ends thereof. With this configuration, the capacitors Cb connected in parallel are able to be switched by switching ON and OFF of each of the pairs of switches SWb, thus varying the capacitance of the overall impedance adjustment circuit 1030.

In the configurations illustrated in FIG. 16A and FIG. 16B, it is sufficient that the plurality of series circuits connected in parallel maybe provided, and two or four or more series circuits may be provided. Furthermore, one of the pair of switches may not be provided.

Figure 16C:
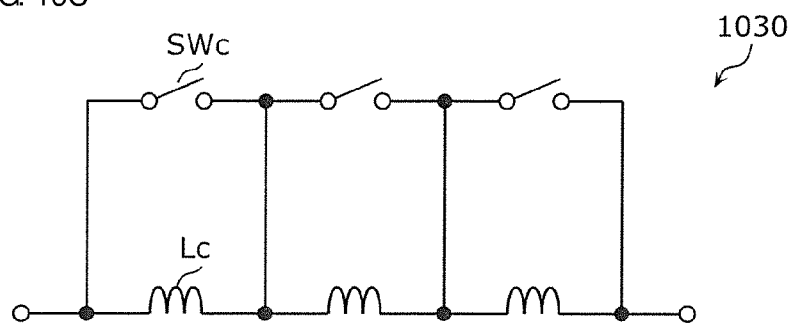
FIG. 16C is still another example of the impedance adjustment circuit in the eleventh variation of a preferred embodiment of the present invention.

As illustrated in FIG. 16C, the impedance adjustment circuit 1030 may be provided by, for example, connecting in series a plurality of parallel circuits each of which includes an inductor Lc and a switch SWc connected thereto in parallel. With this configuration, the inductors Lc connected in series are able to be switched by individually switching ON and OFF of the plurality of switches SWc, thus varying the inductance of the overall impedance adjustment circuit 1030.

In the configuration illustrated in FIG. 16C, capacitors may be provided instead of the inductors Lc.

Figure 16D:
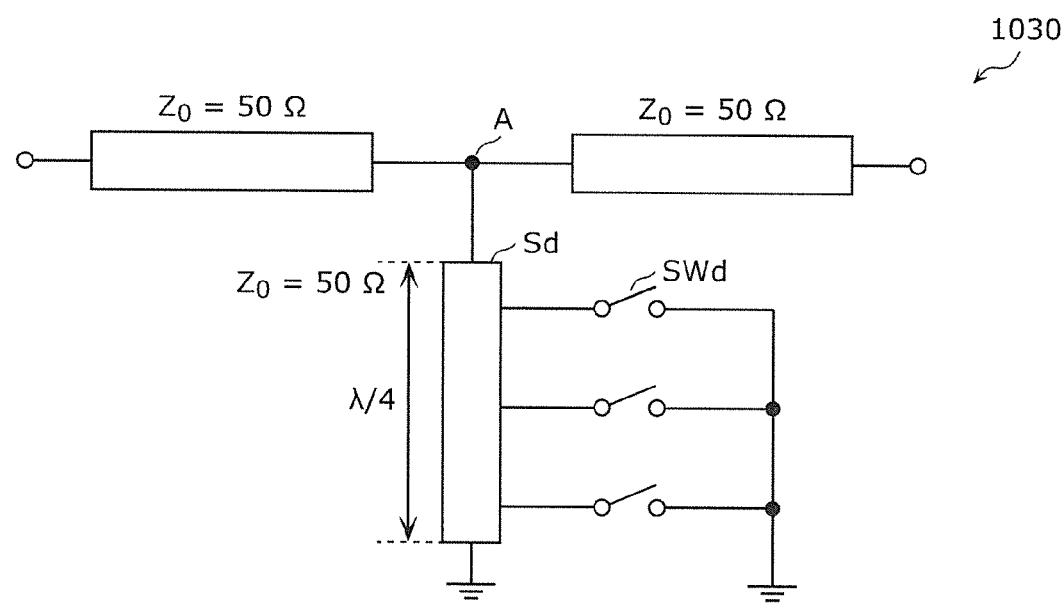
FIG. 16D is still another example of the impedance adjustment circuit in the eleventh variation of a preferred embodiment of the present invention.

Alternatively, as illustrated in FIG. 16D, the impedance adjustment circuit 1030 may include, for example, a short stub Sd provided at a node A on a main path to transmit a high-frequency signal and a plurality of switches SWd. The plurality of switches SWd are connected between a plurality of nodes with different distances from the node A on the short stub Sd and the ground. With this configuration, the node that is connected to the ground on the short stub Sd is able to be switched by switching the switch SWd which is turned ON, thus varying the impedance of the overall impedance adjustment circuit 1030.

Other Variations

Although high-frequency modules according to preferred embodiments of the present invention and variations and modifications thereto have been described above, the present invention is not limited by the above-described preferred embodiment and variations and modifications. The present invention also encompasses other preferred embodiments that are implemented by combining desired components, elements, features, characteristics, functions, etc., in the above-described preferred embodiment and variations and modifications, and variations and modifications obtained by adding various changes to the above-described preferred embodiments, which are conceived by those skilled in the art, without departing from the gist of the present invention, and various apparatuses incorporating high-frequency modules according to preferred embodiments of the present invention and variations and modifications thereto.

For example, a preferred embodiment of the present invention also encompasses the communication apparatus 4 including the high-frequency module 1 described in the first preferred embodiment and the RFIC 3 (RF signal processing circuit). The communication apparatus 4 enables a communication apparatus that is capable of increasing a gain while suppressing deterioration in an NF, is reduced in size and is compatible with multiple bands.

In the above description, for example, the high-frequency module includes the first impedance adjustment circuit that is connected between the connection circuit and the low noise amplifier 40. However, the high-frequency module may not include the first impedance adjustment circuit. That is to say, even when impedance adjustment is not made by the first impedance adjustment circuit, it is sufficient that each of the first and second filters has the output impedance located in the matching region between the NF matching impedance and the gain matching impedance.

In the above description, each of the filters preferably has the output impedance with the capacitive property in its respective pass band. However, each of the filters may have the output impedance having an inductive property in its respective pass band or the output impedance having no imaginary component. Alternatively, some filters may have the output impedances with the capacitive properties in their respective pass bands whereas other filters may have the output impedances having the inductive properties in their respective pass bands.

The respective filters may include elements that are different from the elastic wave resonators and may be configured by, for example, LC elements.

In the third variation of the above-described preferred embodiment, the impedance adjustment circuit 330 has been described as the example of the functional circuit. The functional circuit is not however limited to have the configuration and may be, for example, a filter such as a low pass filter, a coupler, or an isolator. The function that is performed by the functional circuit is able to influence only a specific band (Band C in this example) passing through the third filter by including the functional circuit. When, for example, the low pass filter is provided as the functional circuit, attenuation characteristics at the high frequency side are able to be enhanced by an action of the low pass filter for the above-described specific band.

The above-described functional circuit may be provided instead of the impedance adjustment circuit 430 in the fourth variation of the above-described preferred embodiment. The function that is exerted by the functional circuit is able to influence only specific bands (Band A and Band B in this example) passing through the filters (filters 410A and 410B) provided in the paths (paths 10a and 10b) that are commonly connected by the first initial stage connection circuit.

Preferred embodiments of the present invention are able to be widely used for communication apparatuses such as a cellular phone as a high-frequency module and a communication apparatus, which can be applied to a multiband system, having preferable balance between NF performance and gain performance, and being reduced in size.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a filter;
a low noise amplifier; and
a connection circuit that commonly connects a plurality of paths to the low noise amplifier; wherein
the filter is provided in one of the plurality of paths;
the connection circuit is connected between the filter and the low noise amplifier;
in the one of the plurality of paths in which the filter is provided, the filter and the connection circuit are connected without connecting impedance elements; and
the filter is an acoustic wave filter or includes an elastic wave resonator and has an output impedance located in a matching region between a noise figure matching impedance at which a noise figure of the low noise amplifier is minimum and a gain matching impedance at which a gain of the low noise amplifier is maximum in the pass band of the filter on a Smith chart.

2. The high-frequency module according to claim 1, further comprising a first impedance adjustment circuit that is connected between the connection circuit and the low noise amplifier, wherein
the first impedance adjustment circuit adjusts a first impedance when a circuit portion in which the first impedance adjustment circuit is connected to the low noise amplifier is seen from an output side of the filter in a case in which the noise figure is minimum and the gain is maximum in the pass band of the filter.

3. The high-frequency module according to claim 2, wherein the first impedance adjustment circuit adjusts the first impedance to be any one of inductive or capacitive in the pass band of the filter in the case in which the noise figure is minimum and the gain is maximum.

4. The high-frequency module according to claim 3, wherein
the filter has the output impedance with a capacitive property in the pass band of the filter; and
the first impedance adjustment circuit adjusts the first impedance to be inductive in the pass band of the filter in the case in which the noise figure is minimum and the gain is maximum.

5. The high-frequency module according to claim 1, wherein the connection circuit includes a switch connected to the low noise amplifier.

6. The high-frequency module according to claim 1, wherein the filter includes the elastic wave resonator using surface acoustic waves, bulk waves, or boundary acoustic waves.

7. A communication apparatus comprising:
an RF signal processing circuit that processes a high-frequency signal which is transmitted or received with an antenna element; and
the high-frequency module according to claim 1 transmits or receives the high-frequency signal between the antenna element and the RF signal processing circuit.

8. The communication apparatus according to claim 7, further comprising:
a first impedance adjustment circuit that is connected between the connection circuit and the low noise amplifier; wherein
the first impedance adjustment circuit adjusts a first impedance when a circuit portion in which the first impedance adjustment circuit is connected to the low noise amplifier is seen from an output side of the filter in a case in which the noise figure is minimum and the gain is maximum in the pass band of the filter.

9. The communication apparatus according to claim 8, wherein the first impedance adjustment circuit adjusts the first impedance to be any one of inductive or capacitive in the pass band of the filter in the case in which the noise figure is minimum and the gain is maximum.

* * * * *